(12) United States Patent
Takizawa et al.

(10) Patent No.: US 7,054,188 B2
(45) Date of Patent: May 30, 2006

(54) MAGNETIC MEMORY DEVICE

(75) Inventors: Ryousuke Takizawa, Naka-gun (JP);
Junichi Miyamoto, Yokohama (JP);
Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/012,178

(22) Filed: Dec. 16, 2004

(65) Prior Publication Data
US 2006/0056217 A1    Mar. 16, 2006

(30) Foreign Application Priority Data
Sep. 16, 2004   (JP) .............................. 2004-270096

(51) Int. Cl.
*G11C 11/00* (2006.01)

(52) U.S. Cl. ................. 365/158; 365/230.06; 365/232; 365/171

(58) Field of Classification Search ...................... None
See application file for complete search history.

(56) References Cited

U.S. PATENT DOCUMENTS

| | | | |
|---|---|---|---|
| 6,522,579 B1 | 2/2003 | Hoenigschmid | |
| 6,545,906 B1 | 4/2003 | Savtchenko et al. | |
| 6,714,445 B1 | 3/2004 | Farrar | |
| 6,839,270 B1 * | 1/2005 | Perner et al. | 365/158 |

* cited by examiner

*Primary Examiner*—David Lam
(74) *Attorney, Agent, or Firm*—Oblon, Spivak, McClelland, Maier & Neustadt, P.C.

(57) ABSTRACT

A magnetic memory device includes a memory cell array including MTJ elements provided at the coordinates (x, y). First write lines extend in a direction neither perpendicular nor parallel to the magnetization easy axis direction of the MTJ elements. One and the other end of one first write line pass an upper or lower periphery of the memory cell array and a left or right periphery of the memory cell array, respectively. The first write lines and second write lines sandwich the MTJ elements. First write line drivers are connected to both ends of the first write lines, one and the other end of a pair of the first write line drivers connected to ends of one first write lines are located outside the upper or lower periphery and outside the left or right periphery, respectively. Second write line drivers are connected to both ends of the second write lines.

18 Claims, 18 Drawing Sheets

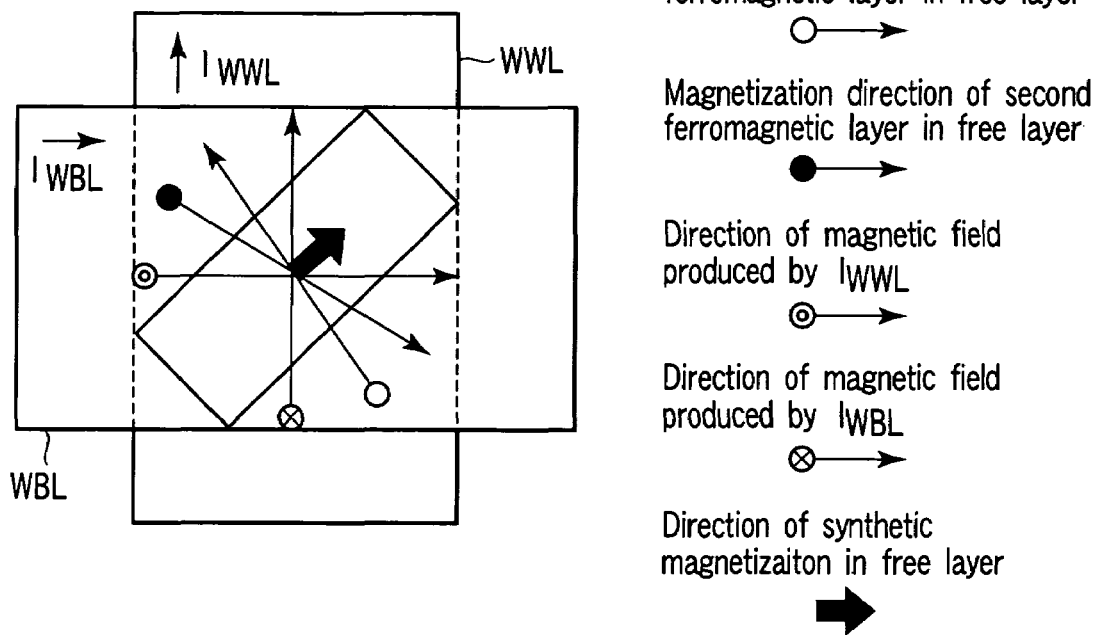

Magnetization direction of first
ferromagnetic layer in free layer
○──▶

Magnetization direction of second
ferromagnetic layer in free layer
●──▶

Direction of magnetic field
produced by $I_{WWL}$
◉──▶

Direction of magnetic field
produced by $I_{WBL}$
⊗──▶

Direction of synthetic
magnetizaiton in free layer
▶

FIG. 27

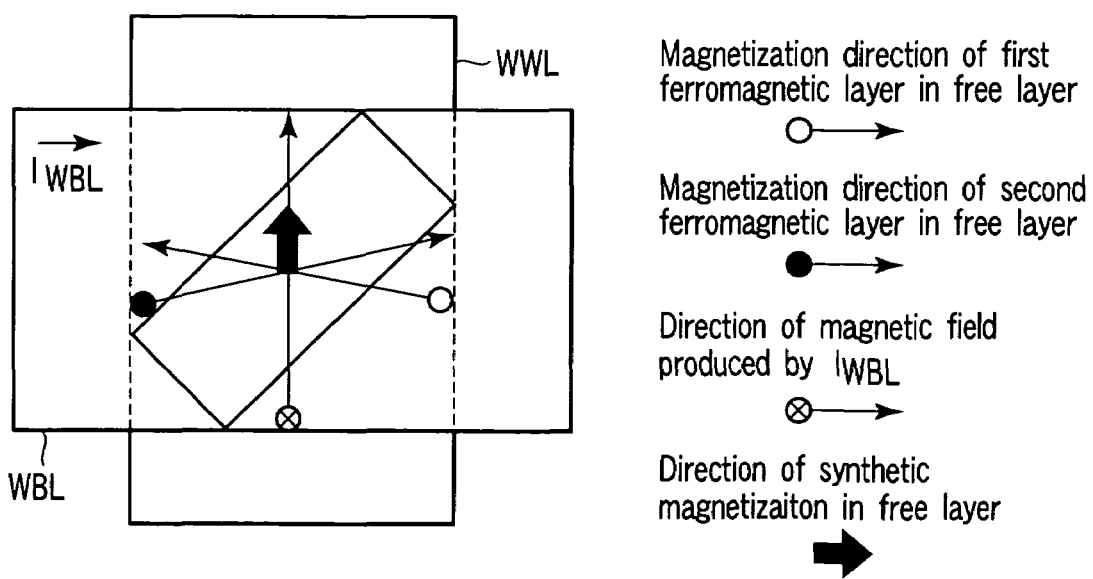

Magnetization direction of first
ferromagnetic layer in free layer
○──▶

Magnetization direction of second
ferromagnetic layer in free layer
●──▶

Direction of magnetic field
produced by $I_{WBL}$
⊗──▶

Direction of synthetic
magnetizaiton in free layer
▶

FIG. 28

MAGNETIC MEMORY DEVICE

CROSS-REFERENCE TO RELATED APPLICATIONS

This application is based upon and claims the benefit of priority from prior Japanese Patent Application No. 2004-270096, filed Sep. 16, 2004, the entire contents of which are incorporated herein by reference.

BACKGROUND OF THE INVENTION

1. Field of the Invention

This invention relates to a magnetic memory device, more particularly to an arrangement of write lines of a magnetic memory device and a decoding method.

2. Description of the Related Art

A memory cell using the TMR (Tunneling Magneto Resistive) effect of a magnetic random access memory (MRAM) is composed of, for example, an MTJ (Magnetic Tunnel Junction) element and a select transistor. One end of the select transistor is connected to the MTJ element and the other end thereof is connected to a ground line. Information is written into the MTJ element by applying a synthetic magnetic field produced by the bit line and the word line to change the direction of the relative spin of two ferromagnetic films.

The direction of the spin of the ferromagnetic film of an MTJ element is commonly changed by a synthetic magnetic field generated by a bit line and a word line crossing at right angles with the MTJ element sandwiched therebetween. U.S. Pat. No. 6,714,445B2 discloses a writing method which uses not only bit lines and word lines but also third write lines crossing neither the bit lines nor the word lines at right angles. Generally, a variation in the size of the shape of the asteroid curve, the distortion of the shape, and misalignment, and other conditions occur among a plurality of MTJ elements during manufacture. As a result, with a synthetic magnetic field produced by an ordinary write current, writing cannot be done, or erroneous writing, such as easy inversion of the information in an unselected MTJ element, is liable to take place. It has been described that use of three types of write lines can increase resistance to erroneous writing.

In addition, U.S. Pat. No. 6,552,579B2 discloses that a magnetic field produced by a bit line not perpendicular to a digit line (or write word line) is applied to an MTJ element.

However, neither U.S. Pat. No. 6,714,445B2 nor U.S. Pat. No. 6,552,579B2 discloses how to configure of a cell array using write lines extending diagonally with respect to the MTJ elements, to arrange the source/sink circuits for the diagonal write lines, and to decode the diagonal write lines.

BRIEF SUMMARY OF THE INVENTION

According to a first aspect of the present invention, there is provided a semiconductor device comprising: a rectangular memory cell array including a plurality of MTJ elements provided at the coordinates (x, y) (x being an integer at least 0 and at most m [m is a natural number], and y being an integer at least 0 and at most n [n being a natural number]) of a first plane defined by an x-axis and a y-axis crossing at right angles; a plurality of first write lines passing the MTJ elements and extending in a direction neither perpendicular nor parallel to a magnetization easy axis direction of the MTJ elements, one end of at least one of the first write lines passing an upper periphery or a lower periphery of the memory cell array, and another end of the at least one of the first write lines passing a left periphery or a right periphery of the memory cell array; a plurality of second write lines, the first write lines and the second write lines sandwiching the MTJ elements; a plurality of first write line drivers connected to both ends of the first write lines, one of a pair of the first write line drivers connected to both ends of at least one of the first write lines being located outside the upper periphery or the lower periphery and another one of the pair of the first write line drivers being located outside the left periphery or the right periphery; and a plurality of second write line drivers connected to both ends of the second write lines.

According to a second aspect of the present invention, there is provided a semiconductor device comprising: a rectangular memory cell array including a plurality of MTJ elements provided at the coordinates (x, y) (x being an integer at least 0 and at most m [m is a natural number], and y being an integer at least 0 and at most n [n being a natural number]) of a plane defined by an x-axis and a y-axis crossing at right angles; a plurality of first write lines passing through the MTJ elements and extending along the x-axis; a plurality of second write lines extending along the y-axis, the first write lines and the second write lines sandwiching the MTJ elements; a plurality of third write lines passing through the MTJ elements and extending so as to generate a magnetic field in a direction in which a synthetic magnetic field of magnetic fields generated by the first write lines and the second write lines passing through the MTJ element to be written into points, one end of at least one of the third write lines passing an upper periphery or a lower periphery of the memory cell array, and another end of the at least one of the third write lines passing a left periphery or a right periphery of the memory cell array; a plurality of first write line drivers connected to both ends of the first write lines; a plurality of second write line drivers connected to both ends of the second write lines; and a plurality of third write line drivers connected to both ends of the third write lines, one of a pair of the third write line drivers connected to both ends of at least one of the third write lines being located outside the upper periphery or the lower periphery and another one of the pair of the third write line drivers being located outside the left periphery or the right periphery.

BRIEF DESCRIPTION OF THE SEVERAL VIEWS OF THE DRAWING

FIG. 27 shows a state of an MTJ element in a write operation;

FIG. 28 shows a state of an MTJ element in a write operation;

DETAILED DESCRIPTION OF THE INVENTION

Figure 1:
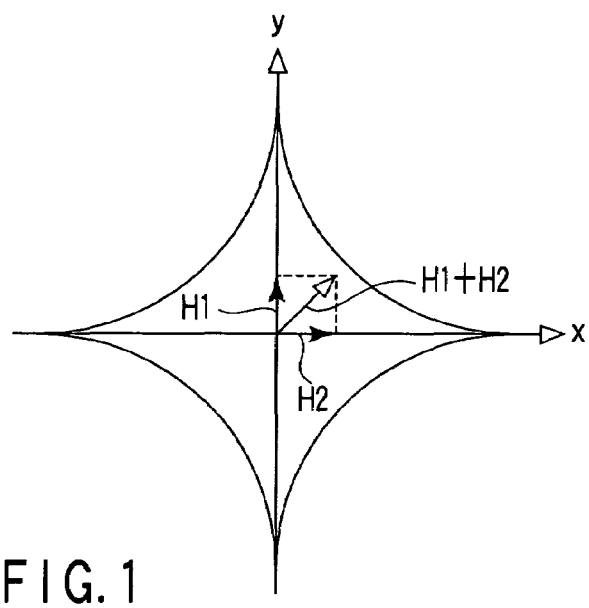
FIG. 1 shows an asteroid curve of a magnetic material and a synthetic magnetic field when two elements of the synthetic magnetic field cross at right angles.

Embodiments of the present invention will now be explained, referring to the accompanying drawings. In the explanation below, component parts which have almost the same function and configuration are indicated by the same reference numerals. A repeated explanation of them will be given only when necessary.

First Embodiment

A first embodiment of the present invention relates to the configuration of a memory cell array and a source/sink circuit (driver circuit), with the write word lines and bit lines not crossing at right angles, and a method of decoding the write lines.

Before giving a concrete explanation of the first embodiment, a writing method using write lines which extend so as to be neither perpendicular nor parallel to the magnetization easy axis direction of an MTJ element will be explained.

FIG. 1 shows an asteroid curve of a magnetic material and a synthetic magnetic field generated when two write lines cross at right angles. When a magnetic field with the magnetic field vector lying inside the asteroid curve is applied, the magnetization direction (or the spin direction) of the magnetic material does not reverse. On the other hand, when a magnetic field with the magnetic field vector reaching outside the asteroid curve is applied, the magnetization direction of the magnetic material reverses.

Typically, either a write bit line and a write word line (hereinafter, referred to as a write line) extends in the magnetization easy axis direction of an MTJ element MTJ (or the longitudinal direction of an MTJ element), that is, in the x-axis direction of FIG. 1. The other line is perpendicular to the magnetization easy axis direction, or extends in the y-axis direction. When information is written, current is caused to flow through the two write lines, thereby applying a synthetic magnetic field H1+H2 of a magnetic field H1 generated in the y-axis direction and a magnetic field H2 generated in the x-axis direction to an MTJ element. By such an operation, the direction of spin of one ferromagnetic film of the MTJ element is changed.

With the word line and the bit line crossing at right angles, to place the vector of the synthetic magnetic field outside the asteroid curve, it is necessary to produce a large current in the write lines. When the magnetic fields H1 and H2 have such magnitudes as shown in FIG. 1, the vector of the synthetic magnetic field H1+H2 does not reach outside the asteroid curve.

Figure 2:
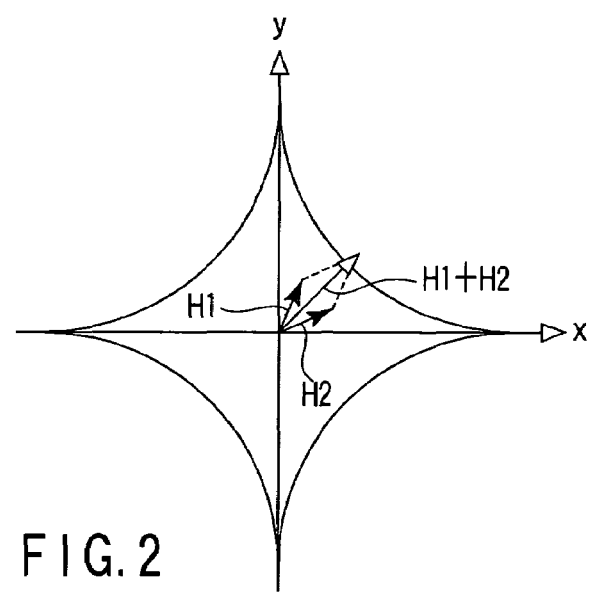
FIG. 2 shows an asteroid curve of a magnetic material and a synthetic magnetic field when two elements of the synthetic magnetic field do not cross at right angles.

FIG. 2 shows an asteroid curve of a magnetic material and a synthetic magnetic field generated when two write lines do not cross at right angles. The two write lines are provided in neither the x- nor the y-axis direction. Therefore, as shown in FIG. 2, the magnetic field H1 generated by one write line appears in a direction rotated a little clockwise from the y-axis. Similarly, the magnetic field H2 generated by the other write line appears in a direction rotated a little counterclockwise from the x-axis. As a result, even when the magnetic fields H1 and H2 have the same magnitudes as in FIG. 1, the vector of the synthetic magnetic field H1+H2 reaches outside the asteroid curve. That is, making the two write lines cross at an angle other than right angles enables information to be written with a smaller current than when they cross at right angles. In addition, the two write lines crossing at an angle other than right angles enable writing even with a current not enough for two write lines crossing at right angles to write.

Figure 3:
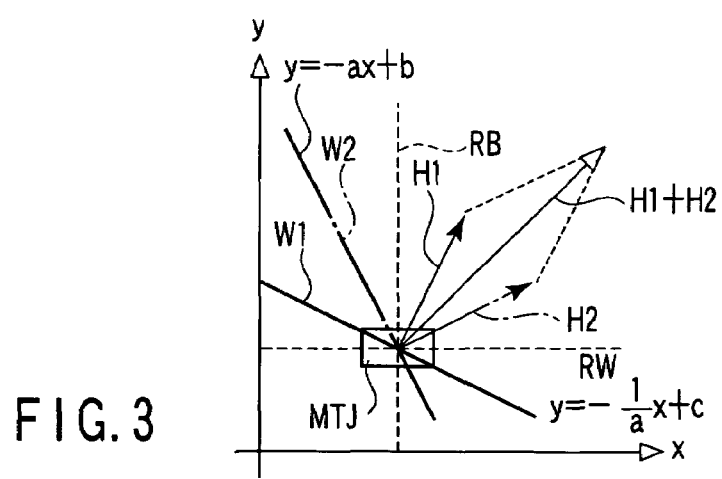
FIG. 3 shows the relationship between an MTJ element and two write lines according to a first embodiment of the present invention.

Next, the first embodiment will be explained by reference to FIGS. 3 to 7. First, a method of arranging two types of write lines (write bit lines and write word lines) for generating a magnetic field in a direction shown in FIG. 2 will be explained. FIG. 3 shows the relationship between an MTJ element according to the first embodiment and two write lines. As shown in FIG. 3, an MTJ element MTJ is provided so that the magnetization easy axis direction may be in line with the x-axis. A read word line RW extends in the x-axis. A read bit line RB is provided along the y-axis perpendicular to the magnetization easy axis direction.

Of two types of write lines necessary for writing, a write line of one type (second write line) W2 is provided along a straight line expressed by $y=-ax+b$ (a and b are constants). A write line of the other type (first write line) W1 is provided along a straight line expressed by $y=-(1/a)x+c$ (c is a constant). FIG. 3 shows an example for $a=2$. The write line W1 generates a magnetic field H1 in a direction perpendicular to the direction in which the write line W1 extends. The write line W2 generates a magnetic field H2 in a direction perpendicular to the direction in which the write line W2 extends. The magnitude of the synthetic magnetic field H1+H2 of the magnetic fields H1, H2 is larger than when the magnetic fields H1, H2 are in line with the x- and y-axes, respectively, as explained in FIG. 2. Therefore, even when the two magnetic fields H1, H2 of the same magnitude as when their directions cross at right angles are used, a larger writing margin is allowed.

Figure 4:
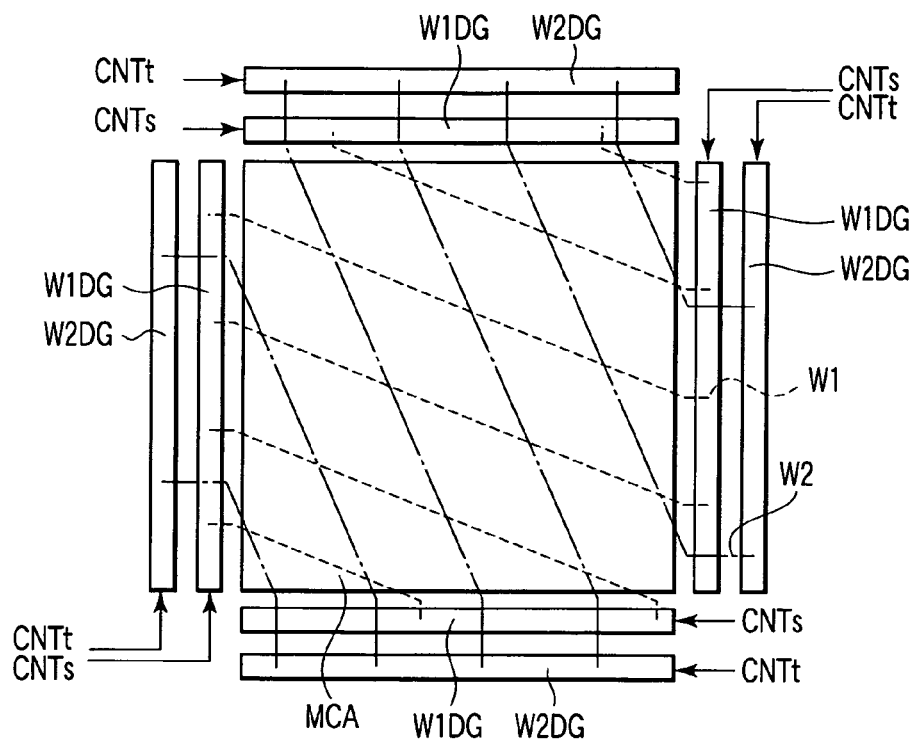
FIG. 4 shows the main part of a magnetic memory device according to the first embodiment, centering on a write operation.
Figure 5:
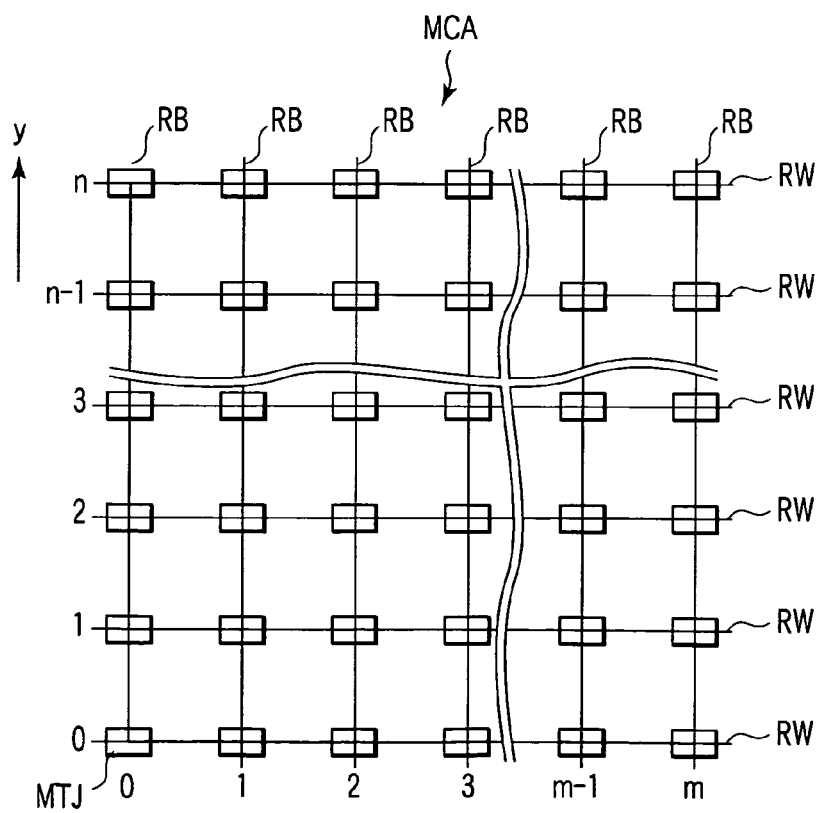
FIG. 5 shows a memory cell array, read word lines, and read bit lines in the first embodiment.

FIG. 4 shows the main part of a magnetic memory device according to the first embodiment, centering on a write operation. The magnetic memory device has a memory cell array MCA. The memory cell array MCA, which may be designed to be rectangular, has a plurality of memory cells. As shown in FIG. 5, the memory cell array MCA has a plane (a first plane) defined by the x- and y-axes crossing at right angles. In the memory cell array MCA, memory cells are provided at the coordinates (x, y). Here, each of x and y is an integer equal to or larger than 0. Various types of MTJ elements configured to be capable of storing information using the TMR effect can be used as the memory cells. Typically, an MTJ element has at least two ferromagnetic films and an insulating film sandwiched between these two films. One ferromagnetic film, which has its magnetization direction fixed to one direction, is generally called a pin layer. The other ferromagnetic film is so configured that its magnetization direction can be parallel or antiparallel to the magnetization direction of the pin layer. The other ferromagnetic film is generally called a free layer. The magnetization direction of the free layer changes according to the magnetic field applied to the free layer. The magnetic field applied to the free layer is generated by, for example, two write lines which sandwich the free layer.

In the memory cell array MCA, each read word line RW extends in the x-axis direction so as to pass through the MTJ elements with the same y-coordinate. Each read bit line RB extends in the y-axis direction so as to pass through the MTJ elements with the same x-coordinate. That is, the coordinates (x, y) corresponds to the address in a read operation.

One of the two ferromagnetic films of each MTJ element MTJ is electrically connected to a read bit line RB. The read bit line RB is connected to, for example, a circuit capable of applying a read voltage applied to an MTJ to be read from when the information is read.

The other of the two ferromagnetic films is connected to one end of a select transistor (not shown) provided for the corresponding one of the MTJ elements. The gate of the select transistor is connected to a read word line RW. The gates of a plurality of select transistors having the same y-axis coordinate are connected to one read word line RW. The read word line RW is connected to a read word line decoder (not shown). The read word line RW corresponding to the MTJ element MTJ to be read from is activated according to the address signal externally applied to the magnetic memory device. The other end of the select transistor is connected to a read circuit (not shown), such as a current conveyer or a sense amplifier.

As shown in FIG. 4, there are provided a plurality of write lines W1 extending along the plane of the memory cell array MCA. In addition, in a plane along the plane of the memory cell array MCA, there are provided a plurality of write lines W2 extending in a direction different from the direction of the write line W1. The write lines W1, W2 are so provided that they cross one another and sandwich the MTJ elements at their intersections. The number of write lines W1, W2 is so determined that the write lines W1, W2 pass over or below all of the MTJ elements according to the inclinations of the write lines W1, W2 in the plane. As explained in FIG. 3, the inclinations of the write lines W1, W2 are so determined that the MTJ elements can be written into even when the magnetic fields H1, H2 generated by the write lines W1, W2 are small. Of the inclinations of the write lines W1, W2, one follows, for example, a straight line expressed by $y=-2x$ and the other follows a straight line expressed by $y=-(1/2)x$.

Write line driver groups W1DG are provided around the memory cell array MCA. A write line driver group W1DG is composed of a plurality of write line drivers (first write line drivers) W1D. In the case of a rectangular memory cell array MCA, the write line drivers extend along the corresponding sides of the MCA. Each write line driver W1D, which is connected to both ends of a write line W1, has a source circuit which causes current to flow and/or a sink circuit which draws current. The write line driver W1D is so configured that the source circuit or sink circuit for the write line driver W1D corresponding to a control signal CNTs from a write line decoder (not shown) operates. The control signal CNTs includes information about control of a specific write line driver W1D so that current may flow through the write line W1 passing through the MTJ element MTJ to be written into. In a pair of write line drivers W1D connected to a write line W1 passing through a target MTJ element MTJ, the source circuit and sink circuit operate so that current may flow in a direction corresponding to the information to be written.

Write line driver groups W2DG are provided around the write line driver groups W1DG. A write line driver group W2DG is composed of a plurality of write line drivers (second line drivers) W2D. In the case of a rectangular memory cell array MCA, the write line drivers extend along the corresponding sides of the MCA. Each write line driver W2D, which is connected to both ends of a write line W2, has a source circuit and/or a sink circuit. The write line driver W2D is so configured that the source circuit or sink circuit for the write line driver W2D corresponding to control signals CNTt from a write line decoder (not shown) operates. The control signals CNTt includes information about control of a specific write line driver W2D so that current may flow through the write line W2 passing through the MTJ element MTJ to be written into. In a pair of write line drivers W2D connected to a write line W2 passing through the MTJ element MTJ to be written into, the source circuit and sink circuit operate so that current may flow in a direction corresponding to the information to be written.

Although the write line driver group W1DG is provided outside the write line driver group W2DG, their positions may be reversed. In addition, for example, only a part of the write line driver group W1DG may be provided inside the write line driver group W2DG.

Figure 6:
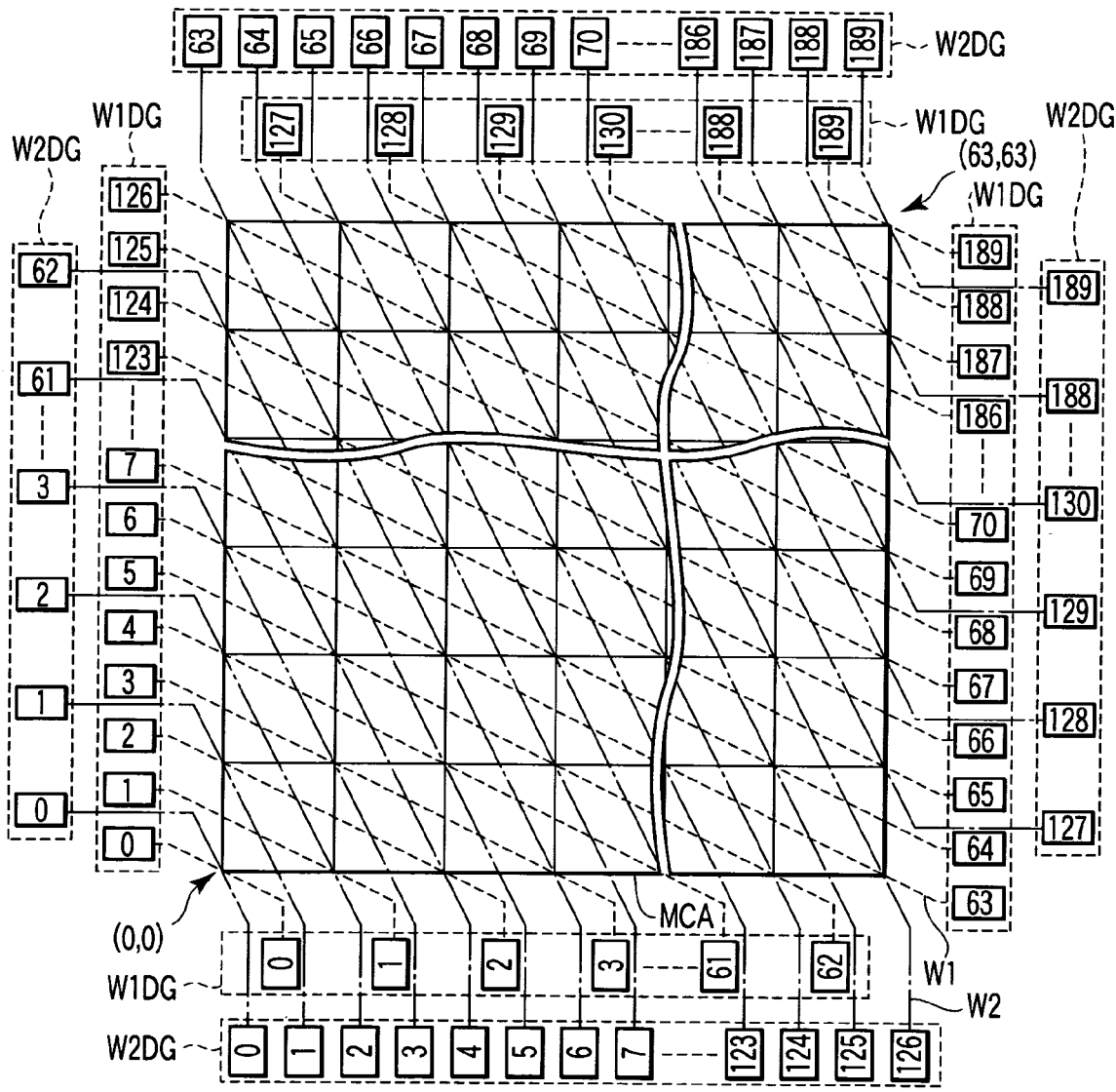
FIG. 6 shows the memory cell array and write line drivers in the first embodiment.

Next, a decoding method in a write operation will be explained by reference to FIG. 6. FIG. 6 shows the memory cell array MCA and write line driver groups W1DG, W2DG in the first embodiment. Although MTJ elements MTJ are omitted in FIG. 6 for the sake of simplification, they are provided on the intersections represented by the coordinates (x, y) in a matrix shown by solid lines as in FIG. 5. In FIG. 5, x corresponds to the coordinate of a read word line and y corresponds to the coordinate of a read bit line. FIG. 6 shows a case where the x-coordinates are in the integer range from 0 to 63 and the y-coordinates are in the integer range from 0 to 63.

As shown in FIG. 6, a write line W1 (shown by a broken line) extends along a straight line expressed by $y=-(1/2)x$. A write line W2 (shown by a dot-dash line) extends along a straight line expressed by $y=-2x$.

A write line driver group W1DG has 190 pairs of write line drivers W1D. In a pair of write line drivers W1D connected to both ends of a write-line W1, the source circuit at one end and the sink circuit at the other end operate simultaneously according to one address.

The write line driver groups W1DG are provided around the memory cell array MCA. A part of the write line driver groups W1DG lying along the lower side of the memory cell array MCA includes one of the pair of write line drivers W1D having any one of the addresses s ranging from 0 to 62. The number in each write line driver W1D indicates the address of the write line driver W1D. A part of the write line driver groups W1DG lying along the right side of the memory cell array MCA includes one of the pair of write line drivers W1D having any one of the addresses s ranging from 63 to 189.

A part of the write line driver groups W1DG lying along the left side of the memory cell array MCA includes the other of the pair of write line drivers W1D having any one of the addresses s ranging from 0 to 126. A part of the write line driver groups W1DG lying along the upper side of the memory cell array MCA includes the other of the pair of write line drivers W1D having any one of the addresses s ranging from 127 to 189.

The write line driver groups W2DG are provided around the write line driver groups W1DG. A part of the write line driver groups W2DG lying along the lower side of the memory cell array MCA includes one of the pair of write line drivers W2D having any one of the addresses t ranging from 0 to 126. The number in each write line driver W2D indicates the address of the write line driver W2D. A part of the write line driver groups W2DG lying along the right side of the memory cell array MCA includes one of the pair of write line drivers W2D having any one of the addresses t ranging from 127 to 189.

A part of the write line driver groups W2DG lying along the left side of the memory cell array MCA includes the other of the pair of write line drivers W2D having any one of the addresses t ranging from 0 to 62. A part of the write line driver groups W2DG lying along the upper side of the memory cell array MCA includes the other of the pair of write line drivers W2D having any one of the addresses t ranging from 63 to 189.

Both ends of the write line W1 passing through the coordinates (0, 0) are connected to a pair of write line drivers W1D with the address s=0. Similarly, with the address s in the range of 0 to 126 (s=0 to 126), both ends of the write line W1 passing through the coordinates (0, s/2) are connected to a pair of write line drivers W1D with the address s. With the address s in the range of 127 to 189 (s=127 to 189), both ends of the write line W1 passing through the coordinates (s−126, 63) are connected to a pair of write line drivers W1D with the address s. That is, the write lines W1 each connected to a pair of write line drivers W1D with the address s in the range of 0 to 189 are arranged on a straight line expressed by $x+2y=s$.

Both ends of the write line W2 passing through the coordinates (0, 0) are connected to a pair of write line drivers W2D with the address t=0. Similarly, with the address t in the range of 0 to 126 (t=0 to 126), both ends of the write line W2 passing through the coordinates (t/2, 0) are connected to a pair of write line drivers W2D with the address t. With the address t in the range of 127 to 189 (t=127 to 189), both ends of the write line W2 passing through the coordinates (63, t−126) are connected to a pair of write line drivers W2D with the address t. That is, the write lines W2 each connected to a pair of write line drivers W2D with the address t in the range of 0 to 189 are arranged on a straight line expressed by $2x+y=t$.

As described above, each write line W1 crosses neither the x- nor y-axis at right angles. Therefore, some write lines W1 extend between the two facing sides of the memory cell array MCA (or between the upper periphery and the lower periphery, between the right periphery and the left periphery). On the other hand, other write lines W1 extend between two adjacent sides (between the upper periphery and the left periphery, between the lower periphery and the right periphery). According to this, some pairs of write line drivers W1D may lie outside the two facing sides of the memory cell array MCA and other pairs of write line drivers W1D may lie outside the two adjacent sides of the memory cell array MCA. The same holds true for the write lines W2 and write line drivers W2D.

In the above description, the upper periphery, the lower periphery, the right periphery, and the left periphery are used to specifically refer the periphery (side) of the memory cell array MCA. This method is taken for the sake of convenience of explanation. Therefore, it is the same as the above depiction if the upper periphery and the lower periphery are interchanged or the memory cell array MCA is rotated 90 degrees.

Next, a method of decoding the memory cell array MCA and write line drivers W1D, W2D configured as shown in FIG. 6 will be explained. As described above, the write lines W1 connected to the corresponding pairs of write line drivers W1D with the address s are arranged on a straight line expressed by $x+2y=s$. In addition, the write lines W2 connected to the corresponding pairs of write line drivers W2D with the address t are arranged on a straight line expressed by $2x+y=t$. Therefore, the address s of the write line W1D and the address t of the write line W2D used in writing data into the MTJ element MTJ at the coordinates (x, y) is determined by substituting x, y into the two equations: $x+2y=s$ and $2x+y=t$.

For example, when the MTJ element MTJ at the coordinates (0, 0) is written into, the write line drives W1D, W2D with the address (s, t)=(0, 0) are used. Similarly, for the coordinates (1, 0), the addresses of the write lines W1D, W2D are (s, t)=(1, 2). For the coordinates (0, 1), the addresses of the write lines W1D, W2D are (s, t)=(2, 1). That is, use of an adding circuit enables the address of an MTJ element MTJ to be decoded in a write operation easily.

In FIG. 6, the arrangement of the individual write line drivers is illustrative and not restrictive. That is, where each write line driver W1D is arranged in the write line driver group W1DG is not limited to the configuration of FIG. 6. Particularly in the case of the write line drivers at the boundary between adjacent sides, for example, the write line drivers W1D with the addresses s=126 and s=127 may be provided on either the upper periphery or the left periphery of the memory cell array MCA. The same holds true for the write line drivers W2D.

Figure 7:
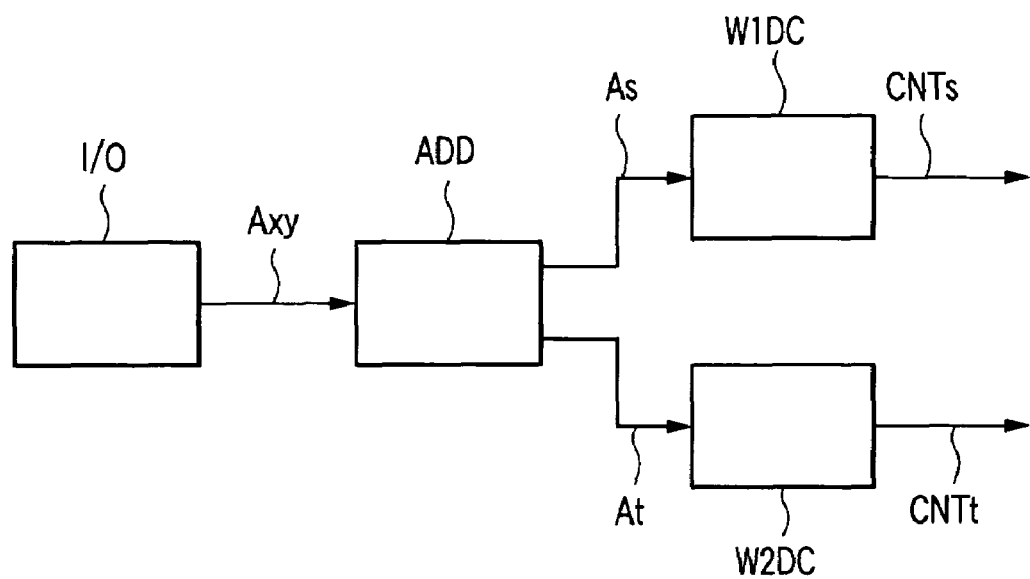
FIG. 7 shows a circuit for generating a write address (s, t)

FIG. 7 shows a circuit for creating a write address (s, t). As shown in FIG. 7, an address signal Axy passed through an input/output control circuit I/O from the outside is supplied to an adding circuit ADD. The adding circuit ADD converts information about x and y included in the address signal Axy into s=x+2y, t=2x+y, thereby outputting signals As, At each including the corresponding pieces of information.

The signal As is supplied to a write line decoder W1DC and the signal At is supplied to a write line decoder W2DC. The write line decoder W1DC uses address information on s included in the signal As and outputs a control signal CNTs to control the write line driver W1D with a specific address s. Similarly, the write line decoder W2DC uses address information on t included in the signal At and outputs a control signal CNTt to control the write line driver W2D with a specific address t. In decoding in a read operation, the address signal Axy is used directly as in a normal method.

In the above explanation, the arrangement of the write line W1 and write line W2 whose addresses s, t are expressed by s=x+2y, t=2x+y has been used as an example. The relationship can be expressed by t=x+ay, t=ax+y (a being a natural number) in the form of general solution.

Moreover, an example of the coordinates of MTJ elements in the range from (0, 0) to (63, 63) has been explained. However, the present invention is not limited to this. For instance, in the case of a memory cell array MCA with the coordinates in the range from (0, 0) to (m, n), the write lines are represented as follows. Each write line W1 extends according to y=−(1/a)x and each write line W2 extends according to y=−ax. Then, an s-th (s being an integer equal to or larger than 0) write line W1 passes through the coordinates (0, s/a) in the range s of 0 to an (s=0 to an) and passes through the coordinates (s−an, n) in the range s of an+1 to an+m (s=an+1 to an+m). In addition, a t-th (t being an integer equal to or larger than 0) write line W2 passes through the coordinates (t/a, 0) in the range t of 0 to am (t=0 to am) and passes through the coordinates (m, t−am) in the range t of am+1 to am+n (t=am+1 to am+n).

With the magnetic memory device according to the first embodiment, the write lines W1, W2 extend diagonally with respect to the magnetization easy axis direction of the MTJ elements MTJ and the write line driver groups W1DG, W2DG are arranged along the top and lower peripheries and right and left peripheries of the memory cell array MCA. The write line drivers W1D, W2D to be activated in a write operation are determined by simple calculations using the addresses of the MTJ elements MTJ. Therefore, the write lines W1, W2 are arranged diagonally with respect to the MTJ elements, which realizes a magnetic memory device capable of writing information with a smaller write current and decoding the write lines easily by using the addresses (x, y) of the memory cells.

Second Embodiment

In the first embodiment, in a plane where a read bit line RB and a read word line RW are arranged in the x- and y-axis directions crossing at right angles, respectively, the magnetization easy axis direction of an MTJ element MTJ extends along the x-axis and the write lines W1, W2 cross neither the x- nor y-axis at right angles. With this configuration, the write lines W1, W2 which are neither perpendicular nor parallel to the magnetization easy axis direction of the MTJ element are arranged. In contrast, in a second embodiment of the present invention, the magnetization easy axis direction of the MTJ element MTJ crosses neither the x- nor y-axis at right angles and one of the write lines W1, W2 extends along the x- or y-axis. The other of the write lines W1, W2 crosses neither the x- nor y-axis at right angles as in the first embodiment. With this configuration, the arrangement where a write line extends diagonally with respect to the magnetization easy axis direction is realized.

Figure 8:
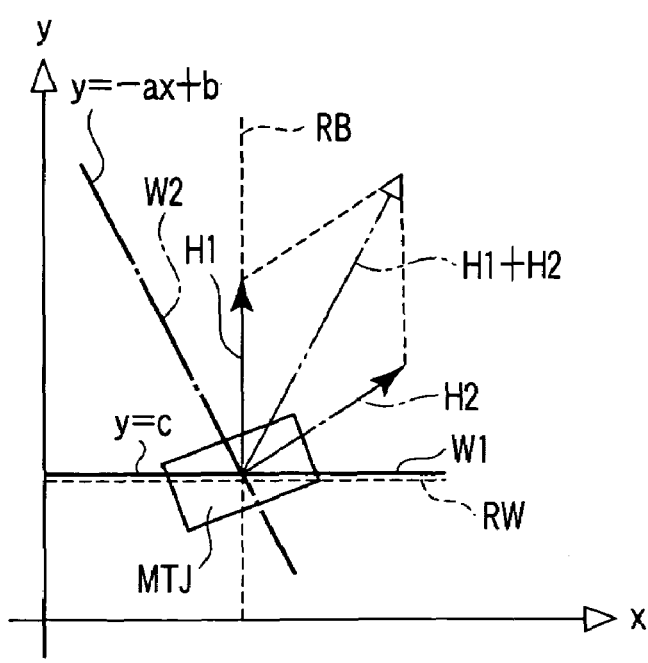
FIG. 8 shows the relationship between an MTJ element and two write lines according to a second embodiment of the present invention.

FIG. 8 shows the relationship between an MTJ element related to a second embodiment of the present invention and two write lines. As shown in FIG. 8, the magnetization easy axis direction of an MTJ element is parallel to neither the x- nor y-axis. A write line W1 is provided parallel to the x-axis direction. Therefore, the write line W1 and the magnetization easy axis direction of the MTJ element MTJ neither cross at right angle nor are parallel to each other. A write line W2 neither crosses the x-axis, y-axis, nor magnetization easy axis direction of the MTJ element at right angles nor is parallel to any of them. The inclination of the write line W2 is set according to a straight line expressed by y=−ax+b. FIG. 8 shows an example for a=2. Even with the configuration of FIG. 8, information can be written with a smaller current than when the write bit line and the write word line cross at right angles as explained in FIG. 3. The read word lines RW and the read bit lines RB are arranged along the x- and y-axis, respectively, as in FIG. 5.

Figure 9:
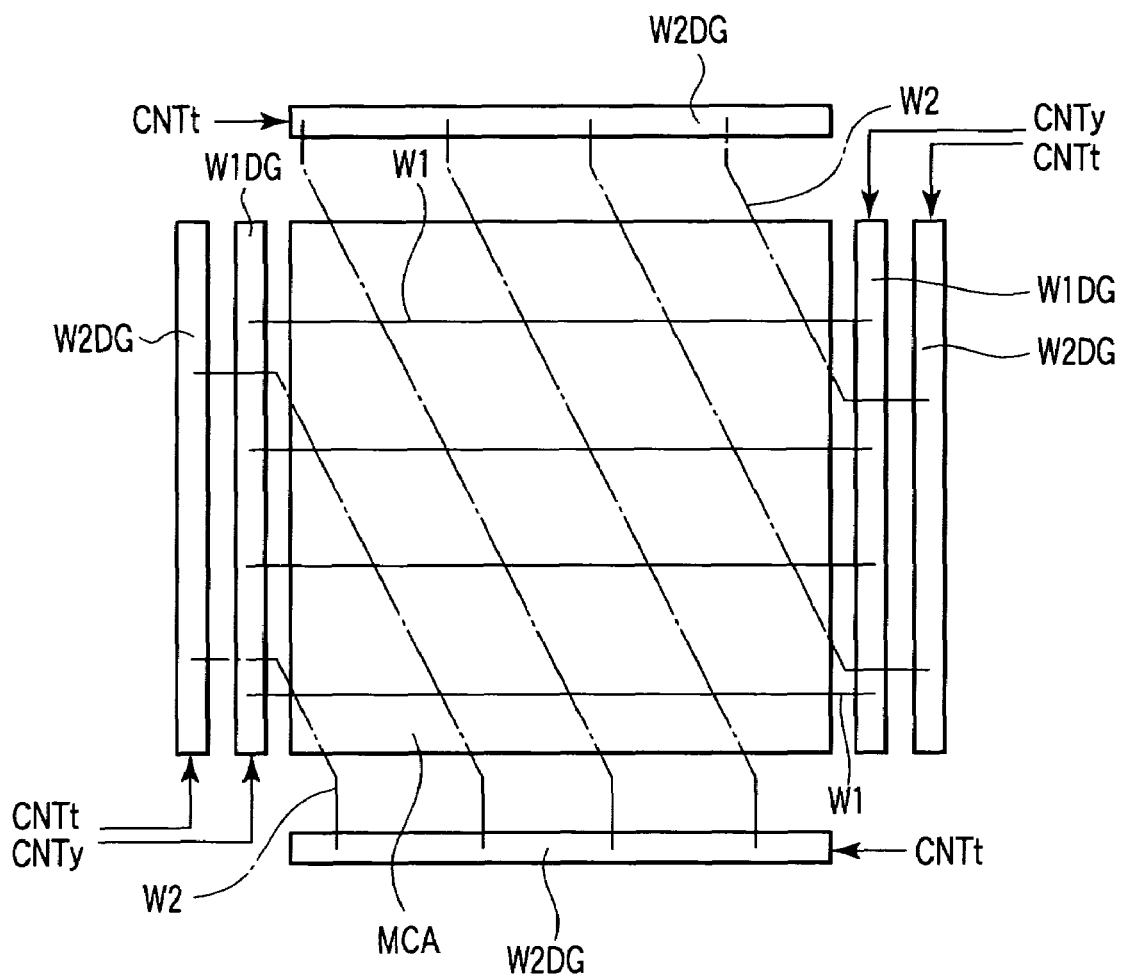
FIG. 9 shows the main part of a magnetic memory device according to the second embodiment, centering on a write operation.

FIG. 9 shows the main part of a magnetic memory device according to the second embodiment, centering on a write operation. The memory cell array MCA has a plurality of MTJ elements (not shown) as in the first embodiment. The magnetization easy axis direction of the MTJ elements MTJ in the memory cell array MCA of FIG. 9 extends in a direction perpendicular to neither the x- nor y-axis. As shown in FIG. 9, the write lines W1 extend along the x-axis and the write line driver groups W1DG are provided along the right side and left side of the memory cell array MCA. A control signal CNTy from a write line decoder (not shown) is supplied to each write line driver W1D constituting the write line drivers W1DG. The write lines W2 and write line driver groups W2DG are the same as in the first embodiment.

Figure 10:
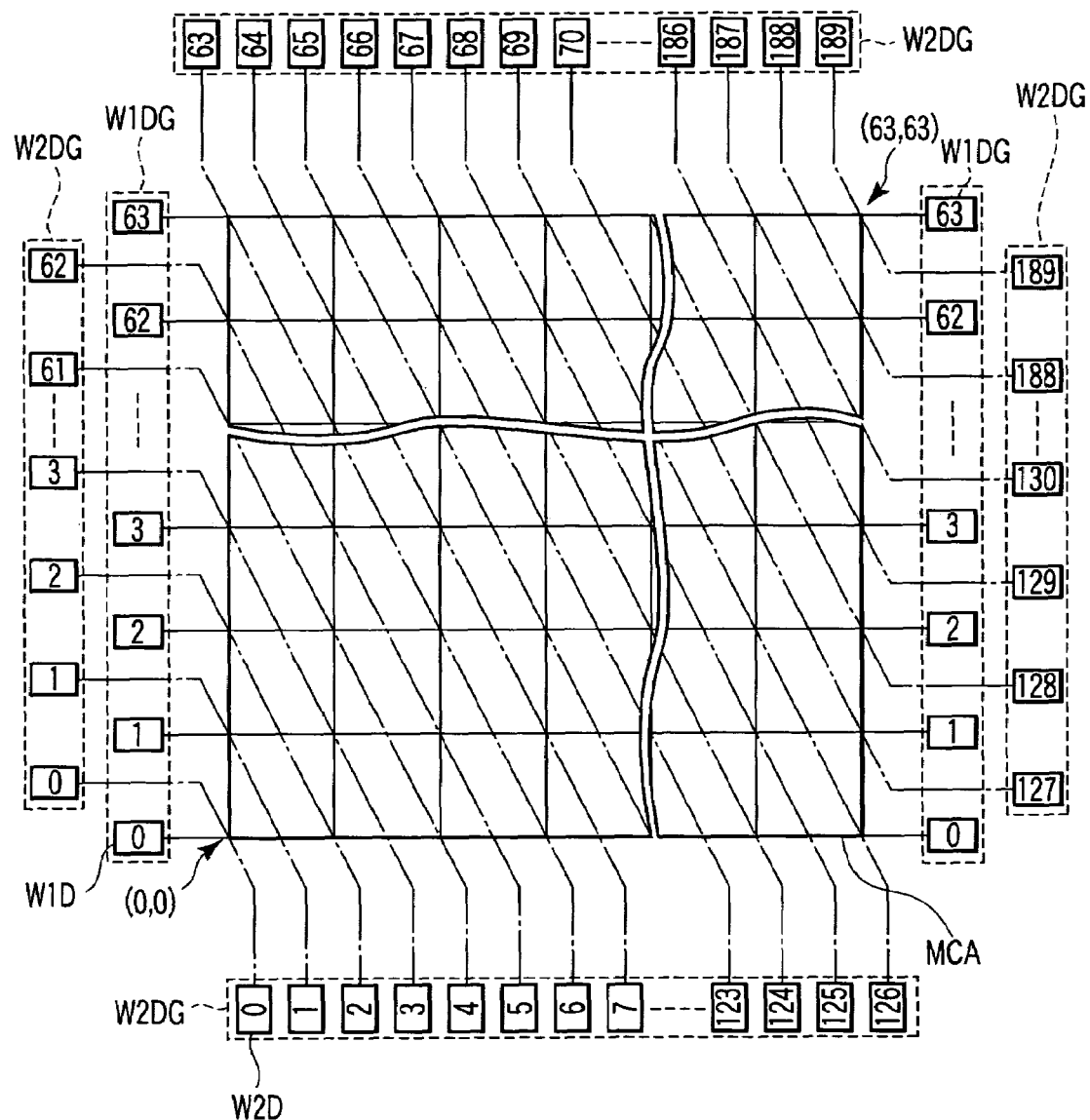
FIG. 10 shows the memory cell array and write line drivers in the second embodiment.

The decoding of the write line drivers W1D, W2D can be realized by combining a conventional method and the first embodiment. FIG. 10 shows the memory cell array MCA and write line drivers W1D, W2D in the second embodiment. As shown in FIG. 10, both ends of each write line W1 whose y-axis coordinate is y (y being an integer equal to or larger than 0) are connected to the write line driver W1D with address y. Therefore, a pair of write line drivers W1D connected to both ends of a certain write line W1 is axisymmetric with a line parallel to the y-axis.

The decoding of the write line driver W1D is done by the same method using address (x, y) as in the prior art. For example, the decoding is done using address y in the address signal Axy of FIG. 7. On the other hand, the decoding of the write line driver W2D is done with the circuit of FIG. 7 by using address t obtained from t=2x+y as in the first embodiment. Moreover, as in the first embodiment, the decoding of the write line can be done using an equation generally expressed by t=ax+y.

With the magnetic memory device of the second embodiment, in a plane where the read bit lines RB and read word lines RW are arranged in the x- and y-axis directions, respectively, the magnetization easy axis direction of the MTJ elements MTJ write lines of one of the two kinds (e.g., the write lines W2) cross neither the x- nor y-axis at right angles and write lines of the other of the two kinds (e.g. the write lines W1) are in parallel to the x-axis. Therefore, as shown in the first embodiment, the write lines W1, W2 are arranged diagonally with respect to the magnetization easy axis direction. The decoding of the write lines parallel to the x- or y-axis is done by the same method as in the prior art. The decoding of the write lines crossing neither the x- nor y-axis at right angles is done by the same method as in the first embodiment. Consequently, even with the second embodiment, as with the first embodiment, it is possible to realize a magnetic memory device capable of writing information with a smaller write current and easily decoding the write lines by using address (x, y).

In the above explanation, of the straight lines decoded using addresses s and t in the first embodiment, the one decoded using t has been used as an example. Of course, the decoding of the write lines may be done using s=x+ay.

Third Embodiment

A third embodiment of the present invention relates to a magnetic memory device which uses not only two ordinary write lines extending along the x- and y-axes but also auxiliary write lines extending diagonally with respect to the magnetization easy axis direction of the MTJ elements.

Figure 11:
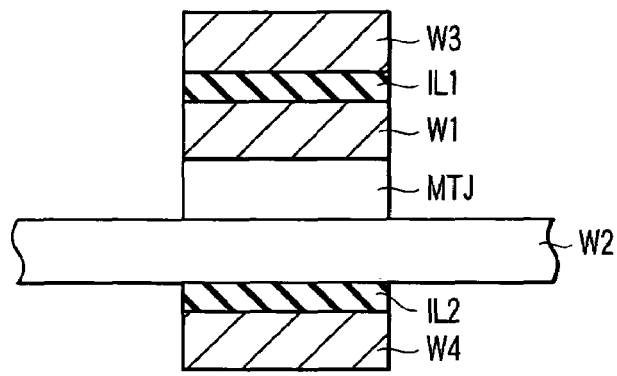
FIG. 11 is a sectional view of a part of the magnetic memory device having three write lines.

First, a magnetic memory device configured so as to be capable of writing data using three types of write lines will be explained. FIG. 11 is a sectional view of a part of the magnetic memory device according to the third embodiment of the present invention which includes three types of write lines. As shown in FIG. 11, there is provided a write line W1 and a write line W2 so as to sandwich an MTJ element MTJ between them at their intersection. The vertical relationship between the write lines W1 and W2 may be the reverse of that in FIG. 11.

The write line W1 and write line W2 cross at right angles. One of them extends in the magnetization easy axis direction of the MTJ element and the other extends in a direction perpendicular to the magnetization easy axis direction. In the example of FIG. 11, the write line W2 extends in the magnetization easy axis direction and the write bit line W1 extends in a direction perpendicular to the magnetization easy axis direction.

Above the write line W1, an auxiliary write line (a third write line) W3 is provided via an insulating film IL1. Below the write line W2, an auxiliary write line (a fourth write line) W4 is provided via an insulating film IL2. The auxiliary write line W3 extends at an inclination of, for example 45° to the write lines W1, W2 in a plane defined by the write lines W1, W2. Similarly, the auxiliary write line W4 extends at an inclination of, for example 45° to the write lines W1, W2 in the plane defined by the write lines W1, W2. The auxiliary write lines W3 and W4 cross at right angles. The vertical relationship between the auxiliary write lines W3 and W4 may be the reverse of that in FIG. 11.

Figure 12:
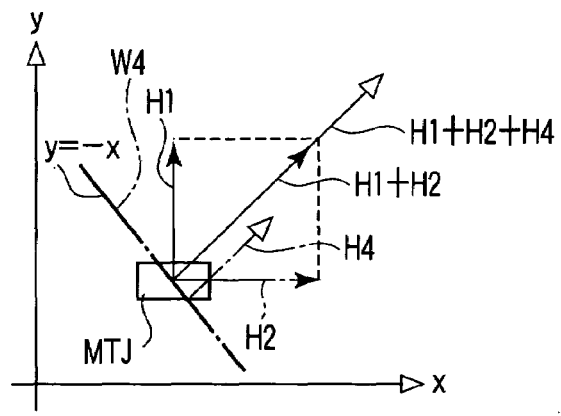
FIG. 12 is a diagram to help explain a write operation using write lines.

FIG. 12 is a diagram to help explain a write operation using the write lines. As shown in FIG. 12, the write line W1 is arranged along the x-axis and the write line W2 is arranged along the y-axis. The auxiliary write line W4 is arranged along a straight line expressed by y=−x. The write line W1 generates a magnetic field H1, the write line W2 generates a magnetic field H2, and the auxiliary write line W4 generates a magnetic field H4. FIG. 12 shows a case where writing is done by the magnetic field H1 in the positive direction of the y-axis and the magnetic field H2 in the positive direction of the x-axis. The direction of current flowing through the auxiliary write line W4 is so determined that the magnetic field H4 is generated in a direction in which the vector of the synthetic magnetic field of the magnetic fields H1, H2 points. This causes the magnetic field H4 to be added to the synthetic magnetic field of the magnetic fields H1, H2 in a write operation, which produces a greater synthetic magnetic field. As a result, the current flowing through the write lines can be reduced as compared with a case where no auxiliary write line is used.

FIG. 12 shows a case where writing is done using a synthetic magnetic field in the first quadrant of the asteroid curve. In the magnetic memory device, there are various ways in which two quadrants of the asteroid curve a synthetic magnetic field is used to write binary information, depending on a combination of the directions of magnetic fields generated by two write lines (or the directions of currents flowing through the write lines).

FIGS. 13 to 16 show a magnetic field applied when the MTJ element MTJ of FIG. 11 is written into and the resulting asteroid curve. A case where the auxiliary write line W3 extends along a straight line expressed by y=x and the auxiliary write line W4 extends along a straight line expressed by y=−x.

Figure 13:
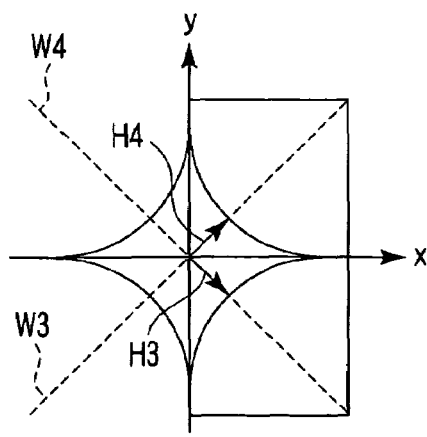
FIG. 13 shows the directions of magnetic fields produced by write lines according to a combination of two quadrants in a write operation.

FIG. 13 shows a case where writing is done using a synthetic magnetic field in the first quadrant and fourth quadrant of the asteroid curve. In this case, a magnetic field Hx in the x-axis direction has only to be generated in the positive direction of the x-axis. As for a write line (a write line along the y-axis) for generating the magnetic filed Hx, a driver and others are so configured that current flows through the write line only in one direction.

Similarly, a magnetic field Hy in the y-axis direction has to be generated in the positive or negative direction, depending on whether any piece of binary information is written. Therefore, as for a write line (a write line along the x-axis) for generating the magnetic filed Hy, a driver and others has to be so configured that current flows through the write line in both directions.

Furthermore, a magnetic field produced by the auxiliary write lines has to be generated in the first quadrant and fourth quadrant. Since this is achieved by the magnetic field H4 generated in the first quadrant by the auxiliary write line W4 and the magnetic field H3 generated in the fourth quadrant by the auxiliary write line W3, the two auxiliary write lines W3, W4 are needed. In this case, current has only to flow only in one direction in the auxiliary write lines W3, W4.

Figure 14:
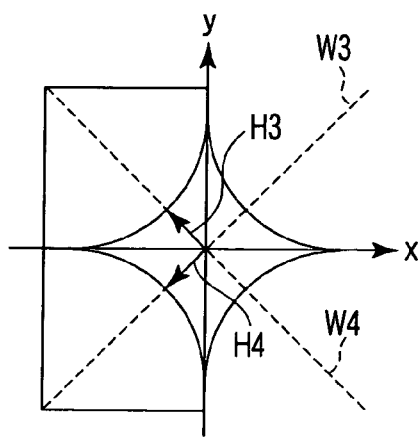
FIG. 14 shows the directions of magnetic fields produced by write lines according to a combination of two quadrants in a write operation.
Figure 15:
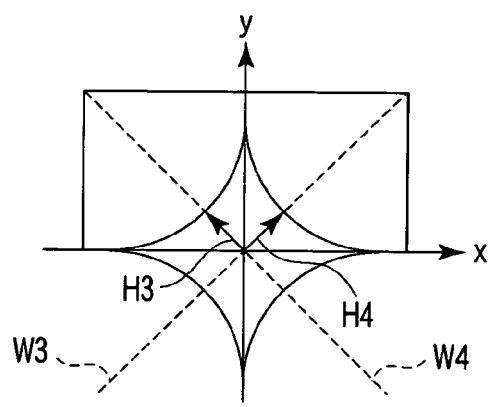
FIG. 15 shows the directions of magnetic fields produced by write lines according to a combination of two quadrants in a write operation.
Figure 16:
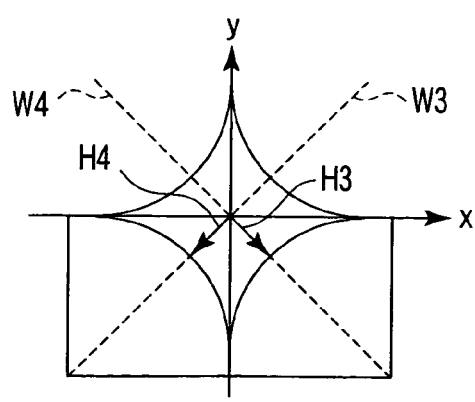
FIG. 16 shows the directions of magnetic fields produced by write lines according to a combination of two quadrants in a write operation.

The same holds true for another combination of two quadrants in FIGS. 14 to 16. A brief explanation will be given below. In the example of FIG. 14, the second quadrant and the third quadrant are used. A driver and others are so configured that the magnetic field Hx is generated only in the negative direction of the x-axis and the magnetic field Hy is generated in the positive or negative direction of the y-axis. The directions of currents in the auxiliary write lines W3, W4 are so determined that the magnetic field H3 is generated in the second quadrant and the magnetic field H4 is generated in the third quadrant. When writing is done in the second quadrant, the magnetic field H3 is used. When writing is done in the third quadrant, the magnetic field H4 is used.

In FIG. 15, the first quadrant and the second quadrant are used. A driver and others are so configured that the magnetic field Hx is generated in the positive or negative direction of the x-axis and the magnetic field Hy is generated only in the positive direction of the y-axis. The directions of currents in the auxiliary write lines W3, W4 are so determined that the magnetic field H3 is generated in the second quadrant and the magnetic field H4 is generated in the first quadrant. When writing is done in the first quadrant, the magnetic field H4 is used. When writing is done in the second quadrant, the magnetic field H3 is used.

In FIG. 16, the third quadrant and the fourth quadrant are used. A driver and others are so configured that the magnetic field Hx is generated in the positive or negative direction of the x-axis and the magnetic field Hy is generated only in the negative direction of the y-axis. The directions of currents in the auxiliary write lines W3, W4 are so determined that the magnetic field H3 is generated in the fourth quadrant and the magnetic field H4 is generated in the third quadrant. When writing is done in the third quadrant, the magnetic field H4 is used. When writing is done in the fourth quadrant, the magnetic field H3 is used.

Figure 17:
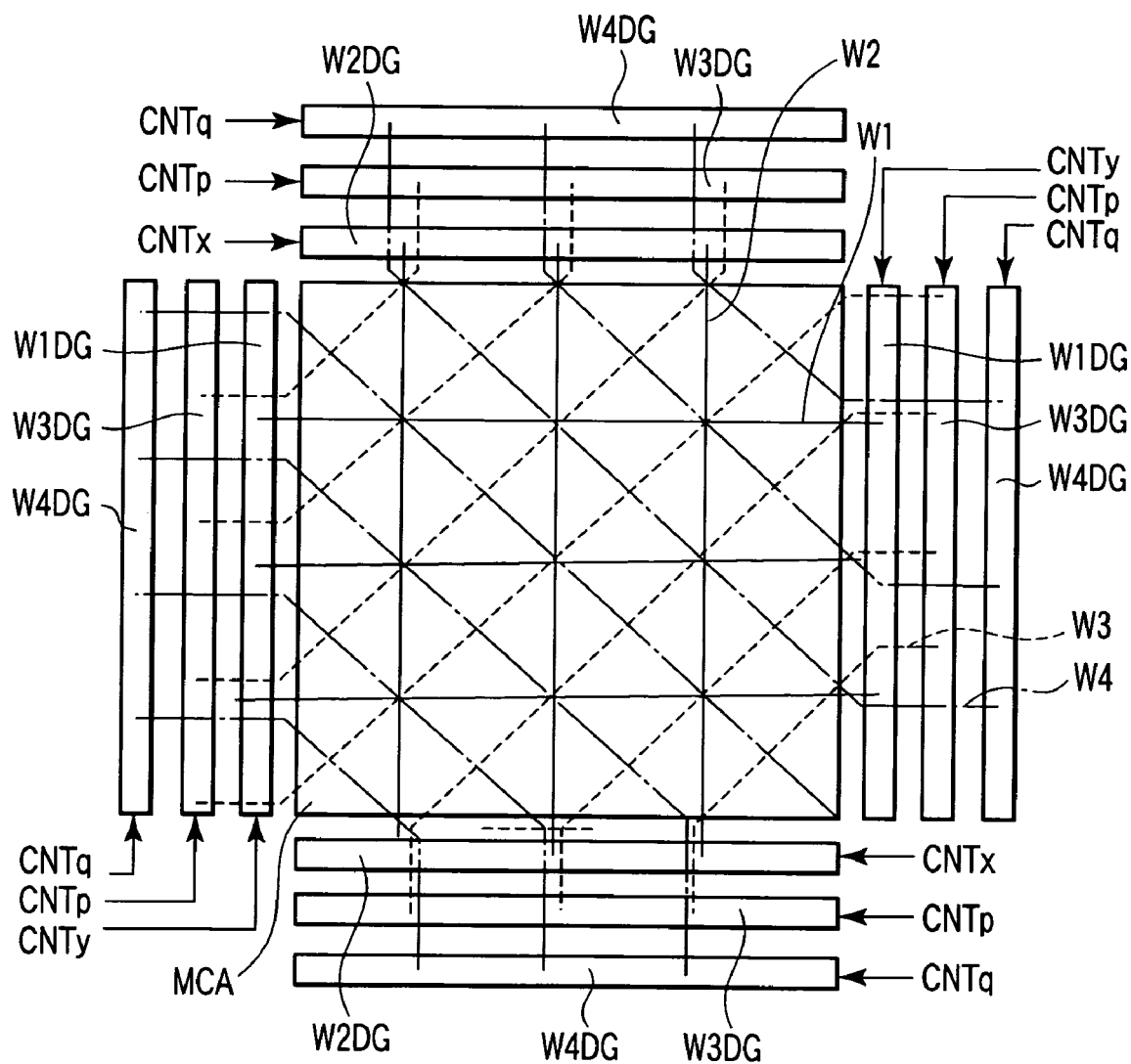
FIG. 17 shows the main part of a magnetic memory device according to a third embodiment of the present embodiment, centering on a write operation.

Next, a decoding method of the magnetic memory device capable of realizing the aforementioned writing method will be explained. FIG. 17 shows the configuration of the main part of the magnetic memory device according to the third embodiment, centering on a write operation. The circuits constituting the read system are the same as in the first embodiment.

As shown in FIG. 17, a plurality of write lines W1, W2 extend along the x- and y-axes of the MTJ elements MTJ, respectively. At the intersections of the write lines W1 and the write lines W2, MTJ elements MTJ (not shown) are provided as in the first embodiment. The magnetization easy axis direction of the MTJ elements MTJ is in line with the x- or y-axis.

In addition, a plurality of auxiliary write lines W3, W4 are provided. Typically, the auxiliary write lines W3, W4 cross at right angles and are at an inclination of 45° to the write lines W1, W2 in a plane along the plane of the memory cell array MCA. The auxiliary write lines W3, W4 sandwich an MTJ element MTJ between them at each of their intersections. The auxiliary write lines W3, W4 are arranged so as to pass over or below all of the MTJ elements MTJ.

Write line driver groups W1DG are provided along the right and left peripheries of the memory cell array MCA. A pair of write line drivers W1D is connected to both ends of one write line W1. Each write line driver W1D operates in such a manner that current corresponding to the information to be written flows through the write line W1 passing through a target MTJ element according to a control signal CNTY.

Write line driver groups W2DG are provided along the upper and lower peripheries of the memory cell array MCA. A pair of write line drivers W2D is connected to both ends of one write line W2. Each write line driver W2D operates in such a manner that current corresponding to the information to be written flows through the write line W2 passing through a target MTJ element according to a control signal CNTX.

Around the write line driver groups W1DG, W2DG, write line driver groups W3DG are provided along each side of the memory cell array MCA. A write line driver group W3DG is composed of a plurality of write line drivers (third write line drivers) W3D. A pair of write line drivers W3D is connected to both ends of one auxiliary write line W3. Each write line driver W3D has a source circuit or/and a sink circuit. Each write line driver W3D operates in such a manner that current in a direction corresponding to the information to be written flows through the auxiliary write line W3 passing through a target MTJ element according to a control signal CNTp.

Around the write line driver groups W3DG, write line driver groups W4DG are provided along each side of the memory cell array MCA. A write line driver groups W4DG are composed of a plurality of write line drivers (fourth write line drivers) W4D. A pair of write line drivers W4D is connected to both ends of one auxiliary write line W4. Each write line driver W4D has a source circuit or/and a sink circuit. Each write line driver W4D operates in such a manner that current in a direction corresponding to the information to be written flows through the auxiliary write line W4 passing through a target MTJ element according to a control signal CNTq.

Whether the write line drivers W1D to W4D have either a source circuit or a sink circuit (or both of them) is determined, depending on which quadrant of the asteroid curve is used to effect writing by reference to the explanations given using FIGS. 13 to 16.

The positional relationship between the write line drives W1DG, W2DG, W3DG, and W4DG is not limited to that shown in FIG. 17. Their positions may be interchanged.

Figure 18:
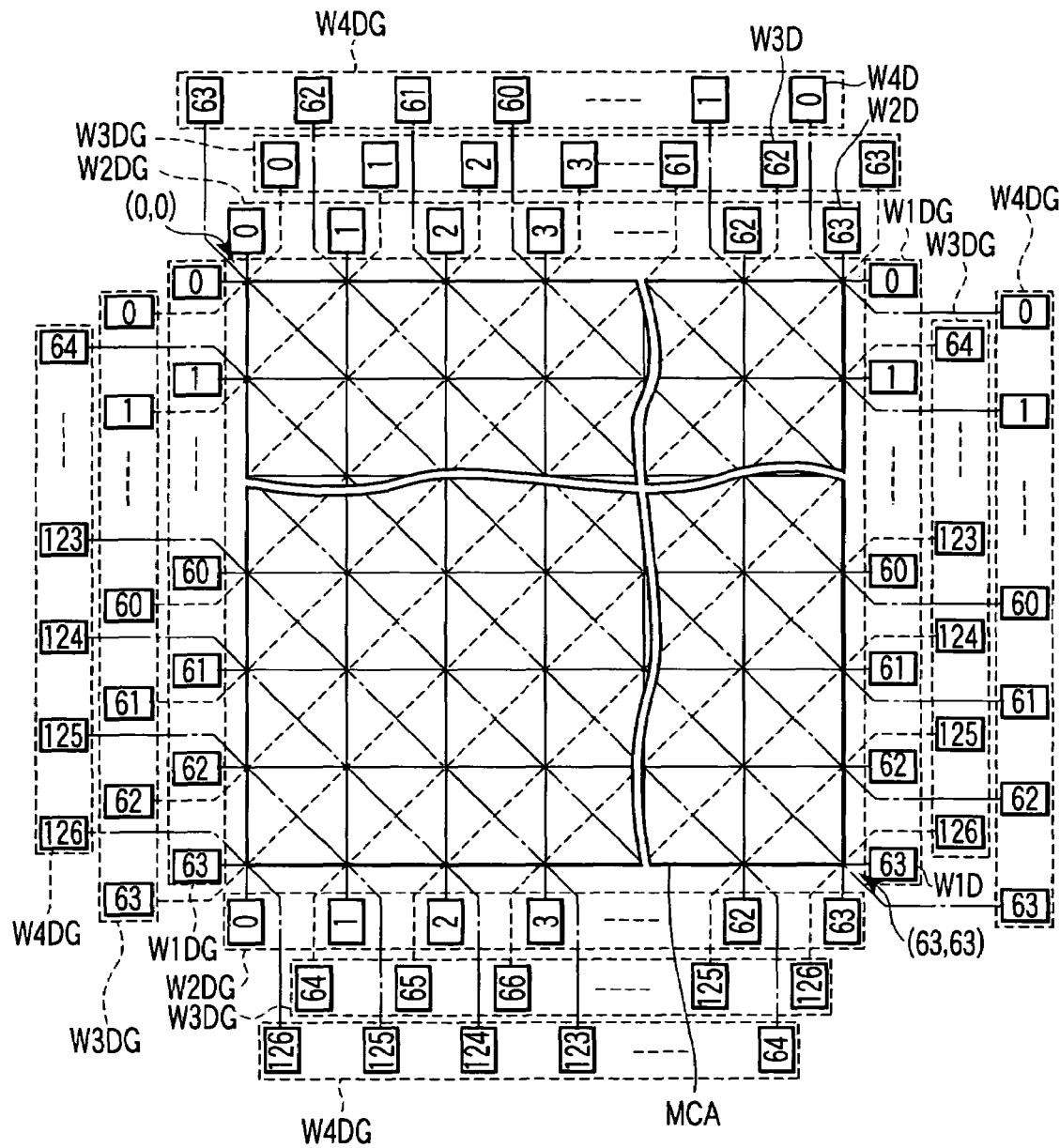
FIG. 18 shows the memory cell array and write line drivers in the third embodiment.

Next, a decoding method in a write operation will be explained by reference to FIG. 18. FIG. 18 shows the memory cell array MCA and write line driver groups W1DG to W4DG in the third embodiment. Although MTJ elements MTJ are omitted in FIG. 18 for the sake of simplification, they are provided at each intersection represented by the coordinates (x, y) in a matrix as in FIG. 5. FIG. 18 shows a case where the x-coordinates are in the integer range from 0 to 63 and the y-coordinates are in the integer range from 0 to 63.

As shown in FIG. 18, auxiliary write line W3 (shown by a broken line) extends along a straight line expressed by y=−x. An auxiliary write line W4 (shown by a dot-dash line) extends along a straight line expressed by y=x.

A write line driver group W1DG has 64 pairs of write line drivers W1D. One of a pair of write line drivers W1D with the addresses y ranging from 0 to 63 (y=0 to 63) is provided along the right periphery of the memory cell array MCA and the other of the pair is provided along the left periphery of the memory cell array MCA. A write line driver group W2DG has 64 pairs of write line drivers W2D. One of a pair of write line drivers W2D with the addresses x ranging from 0 to 63 (x=0 to 63) is provided along the upper periphery of the memory cell array MCA and the other of the pair is provided along the lower periphery of the memory cell array MCA.

A write line driver group W3DG has 127 pairs of write line drivers W3D. One of a pair of write line drivers W3D with any one of the addresses p ranging from 0 to 63 (p=0 to 63) is provided along the left periphery of the memory cell array MCA and the other of the pair is provided along the upper periphery of the memory cell array MCA. One of a pair of write line drivers W3D with any one of the addresses p ranging from 64 to 126 (p=64 to 126) is provided along the right periphery of the memory cell array MCA and the other of the pair is provided along the lower periphery of the memory cell array MCA.

A write line driver group W4DG has 127 pairs of write line drivers W4D. One of a pair of write line drivers W4D with any one of the addresses q ranging from 0 to 63 (q=0 to 63) is provided along the right periphery of the memory cell array MCA and the other of the pair is provided along the upper periphery of the memory cell array MCA. One of a pair of write line drivers W4D with any one of the addresses q ranging from 64 to 126 (q=64 to 126) is provided along the left periphery of the memory cell array MCA and the other of the pair is provided along the lower periphery of the memory cell array MCA.

Both ends of an auxiliary write line W3 passing through the coordinates (0, 0) are connected to a pair of write line drivers W3D with the address p=0. Similarly, with the address p in the range of 0 to 63 (p=0 to 63), both ends of the auxiliary write line W3 passing through the coordinates (0, p) are connected to a pair of write line drivers W3D with the address p. With the address p in the range of 64 to 126 (p=64 to 126), both ends of the auxiliary write line W3 passing through the coordinates (p−63, 63) are connected to a pair of write line drivers W3D with the address p. That is, the auxiliary write lines W3 each connected to a pair of write line drivers W3D with the address p in the range of 0 to 126 are arranged on a straight line expressed by x+y=p.

Both ends of an auxiliary write line W4 passing through the coordinates (63, 0) are connected to a pair of write line drivers W4D with the address q=0. Similarly, with the address q in the range of 0 to 63 (q=0 to 63), both ends of the auxiliary write line W4 passing through the coordinates (63−q, 0) are connected to a pair of write line drivers W4D with the address q. With the address q in the range of 64 to 126 (q=64 to 126), both ends of the auxiliary write line W4 passing through the coordinates (0, q−63) are connected to a pair of write line drivers W4D with the address q. That is, the auxiliary write lines W4 each connected to a pair of write line drivers W4D with the address q in the range of 0 to 126 are arranged on a straight line expressed by (63−x)+y=q.

As described above, each auxiliary write line W3 crosses neither the x- nor y-axis at right angles. Therefore, some auxiliary write lines W3 extend between the two facing sides (i.e., the top and lower peripheries or the right and left peripheries) of the memory cell array MCA. Other auxiliary write lines W3 extend between the two adjacent sides (i.e., the upper periphery and left periphery or the lower periphery and right periphery) of the memory cell array MCA. According to this, some pairs of write line drivers W3D are located outside the two facing sides of the memory cell array MCA. Other pairs of write line drivers W3D are located outside the two adjacent sides of the memory cell array MCA. The same holds true for the auxiliary write lines W4 and the write line drivers W4D.

Next, a decoding method of the memory cell array MCA and write line drivers W3D, W4D configured as in FIG. 18 will be explained. As described above, the auxiliary write lines W3 connected to the pairs of write line drivers W3D with the address p are arranged on a straight line expressed by x+y=p. The auxiliary write lines W4 connected to the pairs of write line drivers W4D with the address q are arranged on a straight line expressed by (63−x)+y=q. Therefore, the address p of the write line driver W3D and the address q of the write line driver W4D used in writing data into the MTJ element MTJ at the coordinates (x, y) are determined by substituting x, y into the equations x+y=p and (63−x)+y=q. For example, when the MTJ element MTJ at the coordinates (0, 0) is written into, the write line driver W3D with p=0 or the write line driver W4D with q=63 is used in addition to the write lines W1, W2. That is, use of the adding circuit enables the address of the MTJ element MTJ to be decoded easily in a write operation. The configuration of the adding circuit is the same as in FIG. 7 of the first embodiment.

In the above explanation, the coordinates of the MTJ elements MTJ range from (0, 0) to (63, 63) have been used. When the memory cell array MCA has the coordinates ranging from (0, 0) to (m, n), it follows that the p-th write line W3 (p being an integer equal to or larger than 0) passes through the coordinates (0, p) in the p range from 0 to n (p=0 to n) and passes through the coordinates (p−n, n) in the p range from n+1 to n+m (p=n+1 to n+m). The q-th write line W4 (q being an integer equal to or larger than 0) passes through the coordinates (m−q, 0) in the q range from 0 to m (q=0 to m) and passes through the coordinates (0, q−m) in the q range from m+1 to m+n (q=m+1 to m+n).

As in the first embodiment, the arrangement of the write line drivers W1D, W2D, W3D, and W4D in FIG. 18 is illustrative and not restrictive. Thus, the arrangement of the write line drivers W3D, W4D along the sides of the memory cell array MCA is not limited to the configuration of FIG. 18.

With the magnetic memory device of the third embodiment, use of the auxiliary write lines W3, W4 in addition to the write lines W1, W2 enables a magnetic field used for writing to be made greater. Then, the write line drivers W3D, W4D to be activated in a write operation are determined by simple calculations using the read addresses of the MTJ elements. Therefore, current is caused to flow in the write lines by simple decoding on the basis of address (x, y), which realizes a magnetic memory device with a larger write margin.

Furthermore, in the third embodiment, an auxiliary magnetic field produced by the write lines W3, W4 is applied in a direction in line with the synthetic magnetic field produced by the write lines W1, W2. Therefore, it is possible to realize a magnetic memory device highly immune to erroneous writing as a result of the shape of the asteroid curve between MTJ elements MTJ being shifted in any direction or being distorted.

Fourth Embodiment

In the third embodiment, one of the two auxiliary write lines W3, W4 is used, depending on whether "0" data or "1" data is written. In a fourth embodiment of the present invention, however, only one of the auxiliary write lines W3, W4 is used.

Figure 19:
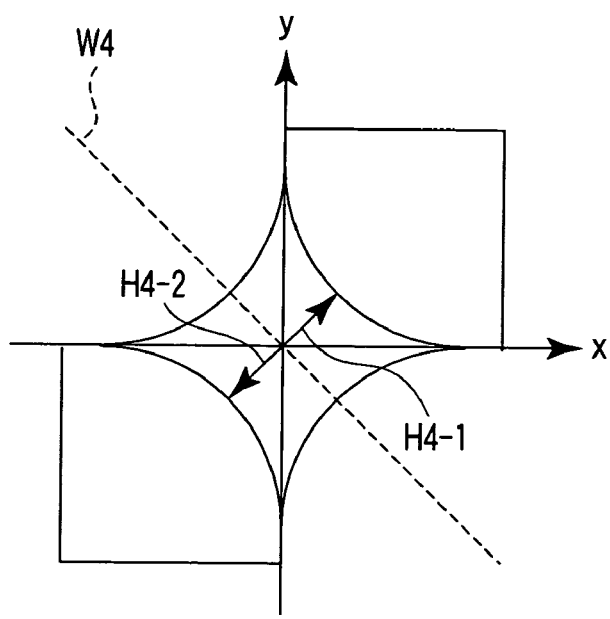
FIG. 19 shows the directions of magnetic fields produced by write lines according to a combination of two quadrants in a write operation.
Figure 20:
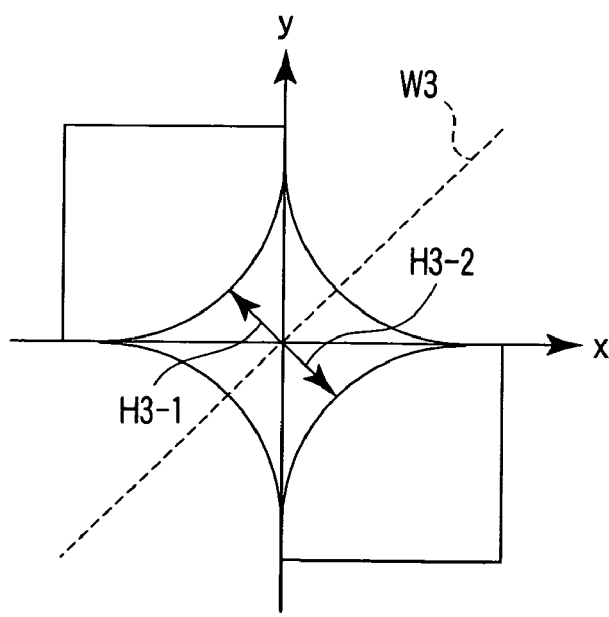
FIG. 20 shows the directions of magnetic fields produced by write lines according to a combination of two quadrants in a write operation.

First, a method of writing information by one auxiliary write line will be explained. FIGS. 19 and 20 are diagrams to help explain a write operation using a write line. FIG. 19 shows a case where data is written using a synthetic magnetic field in the first and third quadrants of an asteroid curve. FIG. 20 shows a case where data is written using a synthetic magnetic field in the second and fourth quadrants of the asteroid curve. In each case of FIGS. 19 and 20, a driver and others are so configured that a magnetic field Hx and a magnetic filed Hy are generated in both of the positive and negative directions of the x- and y-axes, respectively.

In FIG. 19, the auxiliary write line W4 is used as a write line. When writing is done in the first quadrant, a magnetic field H4-1 from the auxiliary write line W4 is used. When writing is done in the third quadrant, a magnetic field H4-2 from the auxiliary write line W4 is used. Therefore, the write line driver W4D has a configuration capable of causing current to flow through the auxiliary write line W4 in both directions.

In FIG. 20, an auxiliary write line W3 is used as a write line. When writing is done in the second quadrant, a magnetic field H3-1 from the auxiliary write line W3 is used. When writing is done in the fourth quadrant, a magnetic field H3-2 from the auxiliary write line W3 is used. Therefore, the write line driver W3D has a configuration capable of causing current to flow through the auxiliary write line W3 in both directions.

The configuration of the driver and the decoding method are the same as in the third embodiment. Specifically, the configuration of the driver is realized by removing either the auxiliary write line W3 and write line drivers W3D or the auxiliary write lines W4 and write line drivers W4D from the configuration of FIGS. 17 and 18. The explanation about either the auxiliary write lines W3 and write line drivers W3D or the auxiliary write lines W4 and write line drivers W4D is applied to the decoding method.

With the magnetic memory device of the fourth embodiment, current is caused to flow through the auxiliary write lines W3, W4 by simple decoding on the basis of address (x, y) as in the third embodiment, which enables a magnetic memory device with a larger write margin to be realized. In addition, it is possible to realize a magnetic memory device highly immune to erroneous writing as in the third embodiment.

Fifth Embodiment

A fifth embodiment of the present invention relates to a magnetic memory device (toggle MRAM) using a so-called toggle writing method. A toggle MRAM is disclosed in U.S. Pat. No. 6,545,906B1 (issued to Savtchenko, et al.). The magnetization easy axis direction of an MTJ element MTJ in a toggle MRAM extends in a direction inclined at an angle of 45° to a write bit line and a write word line in a plane defined by the write bit line and write word line. The configuration of an MTJ element and the timing with which a write current is caused to flow are different from those in the prior art.

Figure 21:
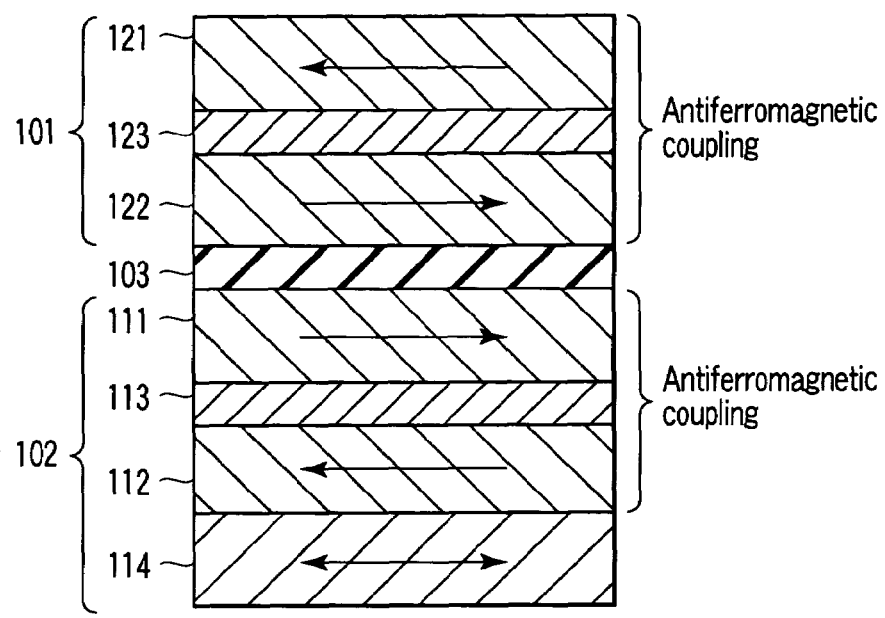
FIG. 21 shows a state of the structure of an MTJ element used in a toggle MRAM.

First, a magnetic memory device using a toggle writing method will be explained below. FIG. 21 is a sectional view schematically showing the configuration of an MTJ element usable for a toggle MRAM. FIG. 21 shows a state where the magnetization direction of a free layer and that of a pin layer are parallel to each other. As shown in FIG. 21, an insulating tunnel barrier layer 103 is sandwiched between a free layer 101 and a pin layer 102. The pin layer 102 includes two ferromagnetic layers 111, 112 made of ferromagnetic metal, a paramagnetic layer 113 made of paramagnetic metal sandwiched between the ferromagnetic layers 111, 112, and an antiferromagnetic layer 114 made of antiferromagnetic metal. A structure composed of the ferromagnetic layers 111, 112 and paramagnetic layer 113 is provided on the antiferromagnetic layer 114. The two ferromagnetic layers 111, 112 are in antiferromagnetic coupling.

The free layer 101 includes two ferromagnetic layers 121, 122 made of ferromagnetic metal and a paramagnetic layer 123 made of paramagnetic metal sandwiched between the ferromagnetic layers 121, 122. The two ferromagnetic layers 121, 122 are in antiferromagnetic coupling. In the parallel state, the magnetization directions of the two ferromagnetic layers 111, 122 sandwiching the tunnel barrier layer 103 between them are parallel to each other.

Figure 22:
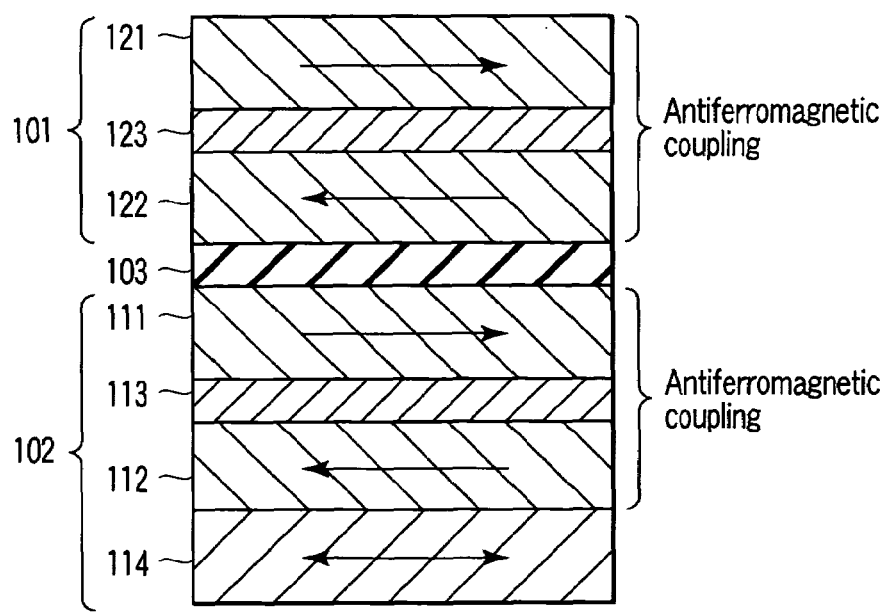
FIG. 22 shows a state of the structure of an MTJ element used in a toggle MRAM.

On the other hand, when the MTJ element MTJ is antiparallel, the magnetization directions of the two ferromagnetic layers 111, 122 sandwiching the tunnel barrier layer 103 between them are in an antiparallel state as shown in FIG. 22.

Next, a writing method using a toggle writing method will be explained briefly below. When the toggle writing method is used, data about the MTJ element to be written into is first read out. If the read-out data coincides with the write data, no writing is done. Only when they do not coincide with each other, is writing done.

In the toggle writing method, after writing is done, the state of the MTJ element changes, regardless of the state of the MTJ element before the writing. For example, as a result of writing, the MTJ element in the antiparallel state changes to the parallel state, whereas the MTJ element in the parallel state changes to the antiparallel state.

Figure 23:
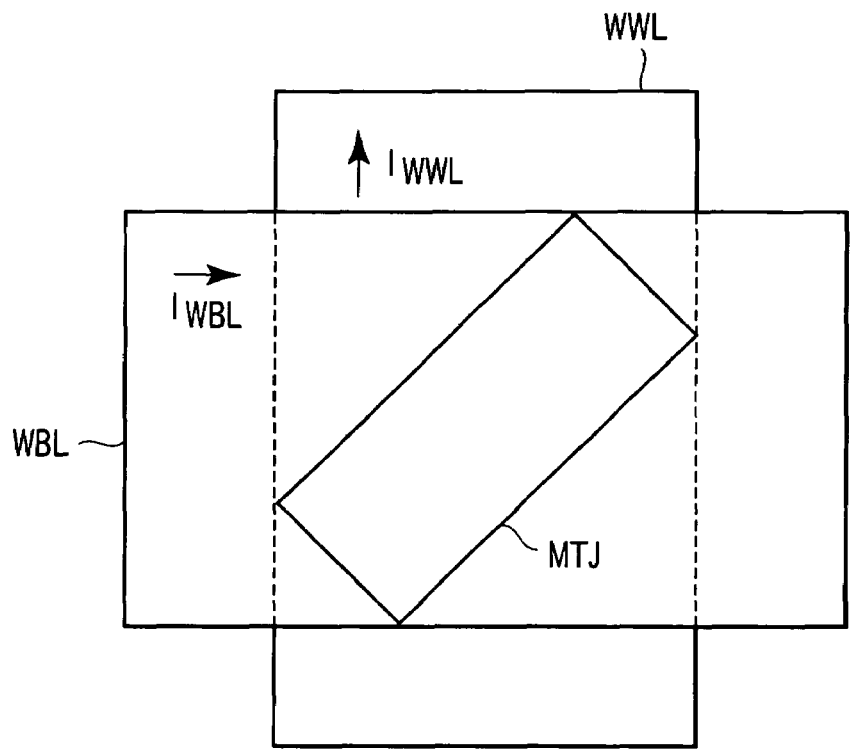
FIG. 23 shows the direction of current flowing thorough a write line.
Figure 24:
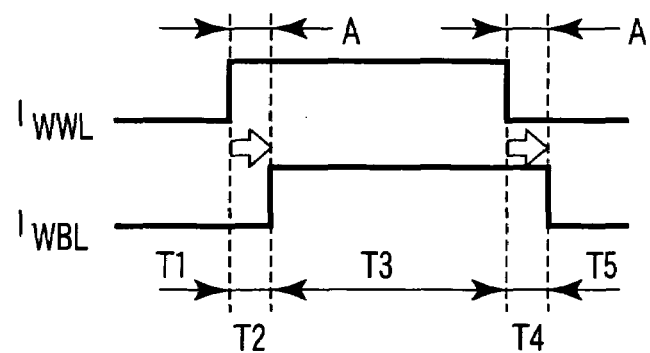
FIG. 24 shows write current supply timing.

As shown in FIG. 23, to reverse the state of the MTJ element, IWWL is caused to flow in the write word line WWL and IWBL is caused to flow in the write bit line WBL. The timing with which the write currents IWWL, IWBL are supplied is set as shown, for example, in FIG. 24. As shown in FIG. 24, there is a time lag of a specific period A between the timing with which the write current IWWL is supplied and the timing with which the write current IWBL is supplied.

Hereinafter, the state of the MTJ element MTJ in each of periods T1 to T5 shown in a waveform diagram of FIG. 24 will be explained. During the time when the write operations below are carried out, the magnetization directions of the ferromagnetic layers of the pin layer remain unchanged.

Period T1 (Initial State)

Figure 25:
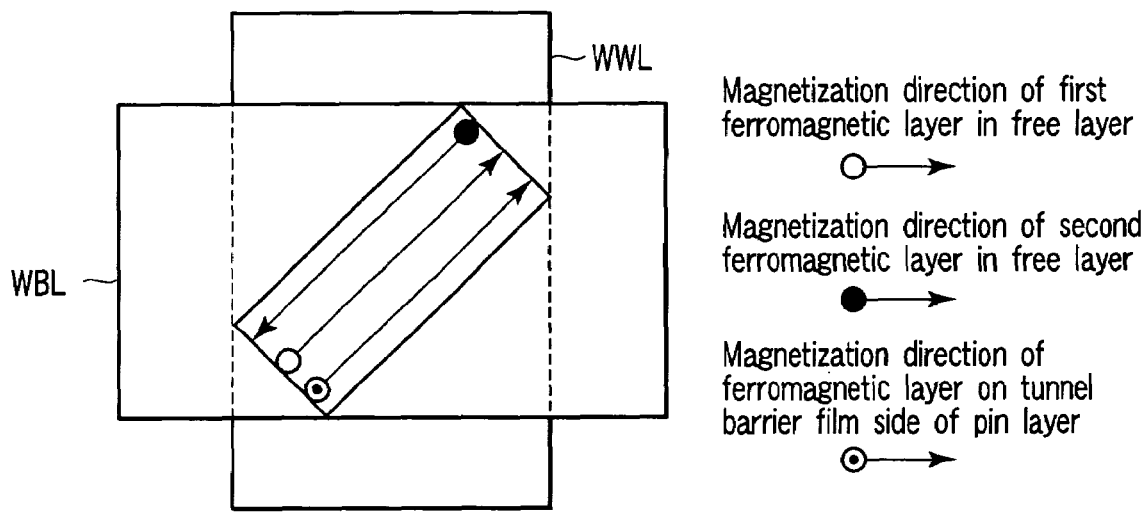
FIG. 25 shows a state of an MTJ element in a write operation.

As shown in FIG. 25, the MTJ element MTJ is in the parallel or antiparallel state according to the magnetization directions of the two ferromagnetic layers facing each other with the tunnel barrier film between them. That is, in FIGS. 25 to 29, of the two ferromagnetic layers of the free layer, the first and second ferromagnetic layers correspond to one of the ferromagnetic layers 121, 122 in FIGS. 21 and 22. Then, when the magnetization direction of the ferromagnetic layer 122 in FIGS. 21 and 22 corresponds to the magnetization direction of the first ferromagnetic layer in FIG. 25, the MTJ element is in the parallel state in the initial state. On the other hand, when the magnetization direction of the ferromagnetic layer 122 in FIGS. 21 and 22 corresponds to the magnetization direction of the second ferromagnetic layer in FIG. 25, the MTJ element is in the antiparallel state in the initial state. Since the magnetization directions of the first and second ferromagnetic layers in the free layer are opposite to each other, the synthetic magnetic field in the free layer is almost zero.

Period T2 (Supplying IWWL)

Figure 26:
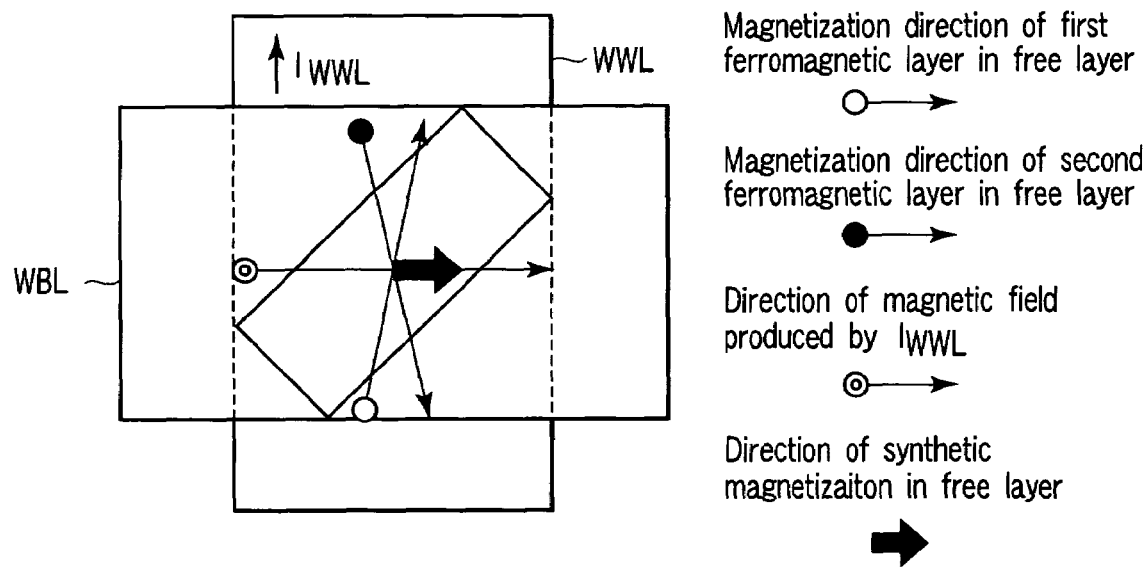
FIG. 26 shows a state of an MTJ element in a write operation.

As shown in FIG. 26, the write current IWWL is caused to flow through the write word line WWL, a magnetic field is generated by the write current IWWL. As a result, the magnetization directions of the first and second ferromagnetic layers in the free layer try to point in the direction in which the magnetic field is generated by the write current IWWL, with the result that a synthetic magnetization direction appears in the free layer.

Here, the antiferromagnetic coupling of the two ferromagnetic layers in the free layer is so adjusted that each of the magnetization directions of the two ferromagnetic layers is prevented from pointing in the direction of the magnetic field generated by the write current IWWL. Each of the magnetization directions of the two ferromagnetic layers in the free layer rotates clockwise (or counterclockwise), while keeping the antiferromagnetic coupling, trying to point in the direction of the magnetic field generated by the write current IWWL. Then, at the time when the synthetic magnetization direction of the free layer coincides with the direction of the magnetic field generated by the write current IWWL, the rotation of the magnetization directions of the two ferromagnetic layers in the free layer stops. That is, as a result of the rotation, the direction of the synthetic magnetization direction of the free layer points in a direction parallel to the write bit line WBL.

Period T3 (Supplying IWWL, IWBL)

Next, as shown in FIG. 27, in a state where the write current IWWL is flowing in the write word line WWL, the write current IWBL is caused to flow in the write bit line WBL, with the result that a synthetic magnetic field is generated by the write currents IWWL, IWBL. Consequently, each of the magnetization directions of the two ferromagnetic layers in the free layer rotates until the direction of the synthetic magnetization direction of the free layer has coincided with the direction of the synthetic magnetization direction generated by the write currents IWWL, IWBL, while keeping the antiferromagnetic coupling. That is, as a result of the rotation, the direction of the synthetic magnetization direction of the free layer points in the magnetization easy axis direction of the MTJ element.

Period T4 (Supplying IWBL)

Next, as shown in FIG. 28, when the write current IWWL flowing in the write word line WWL is cut off, a magnetic field is generated only by the write current IWBL flowing in the write bit line WBL. As a result, each of the magnetization directions of the two ferromagnetic layers in the free layer rotates until the direction of the synthetic magnetization direction of the free layer has coincided with the direction of the synthetic magnetization direction generated by the write current IWBL, while keeping the antiferromagnetic coupling. That is, as a result of the rotation, the direction of the synthetic magnetization direction of the free layer points in a direction parallel to the write word line WWL.

Period T5 (Completing the writing)

Figure 29:
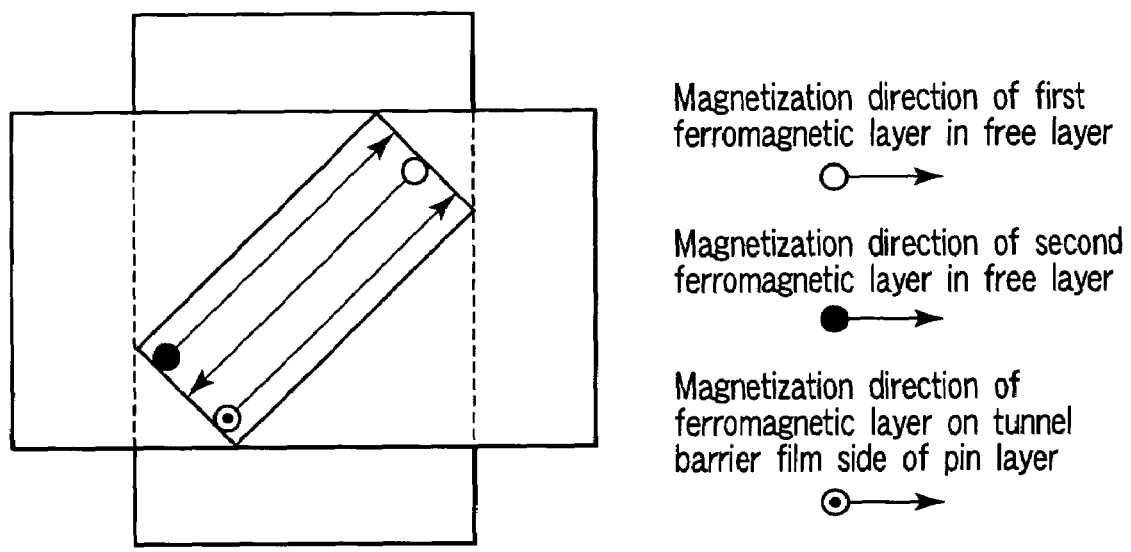
FIG. 29 shows a state of an MTJ element in a write operation.

Next, as shown in FIG. 29, when the write current IWBL flowing in the write word line WBL is cut off, each of the magnetization directions of the two ferromagnetic layers in the free layer rotates until it has coincided with the magnetization easy axis direction of the MTJ element MTJ, while keeping the antiferromagnetic coupling.

Here, since each of the magnetization directions of the two ferromagnetic layers in the free layer is becoming the reverse of the direction in the initial state after the period T4 has elapsed, the reverse of the direction in the initial state is stable in terms of energy after the cutting off of the write current. As a result, the state of the MTJ element is reversed.

In this embodiment, as shown in FIG. 24, the timing with which current is caused to flow in the write word line WWL is made a specific delay time A earlier than the timing with which current is caused to flow in the write bit line WBL. Conversely, the timing with which current is caused to flow in the write bit line WBL may be made a specific delay time A earlier than the timing with which current is caused to flow in the write word line WWL. In this case, the direction in which the magnetization direction rotates differs from that in the above embodiment. However, as in the above embodiment, the magnetization directions of the two ferromagnetic layers in the free layer rotate in such a manner that the synthetic magnetization direction of the free layer points in the direction of the magnetic field generated by the write word line WWL and write bit line WBL at a certain point in time.

Figure 30:
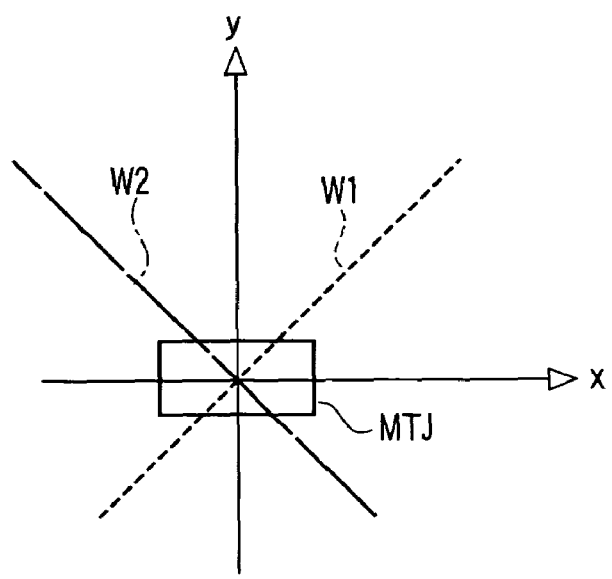
FIG. 30 shows the relationship between an MTJ element and two write lines according to a fifth embodiment of the present invention.

Next, the fifth embodiment of the invention related to a magnetic memory device to which the aforementioned toggle writing method is applied will be explained. FIG. 30 shows the relationship between an MTJ element and two write lines. As shown in FIG. 30, an MTJ element MTJ is so provided that its magnetization easy axis direction is in line with the x-axis direction. A write line W1 is provided according to y=x. A write lines W2 is provided according to y=−x. The read word line RW or read bit line RB extends along the x-axis and the other extends along the y-axis. With this configuration, the magnetic memory device can be configured so as to be compatible with the toggle writing method.

Figure 31:
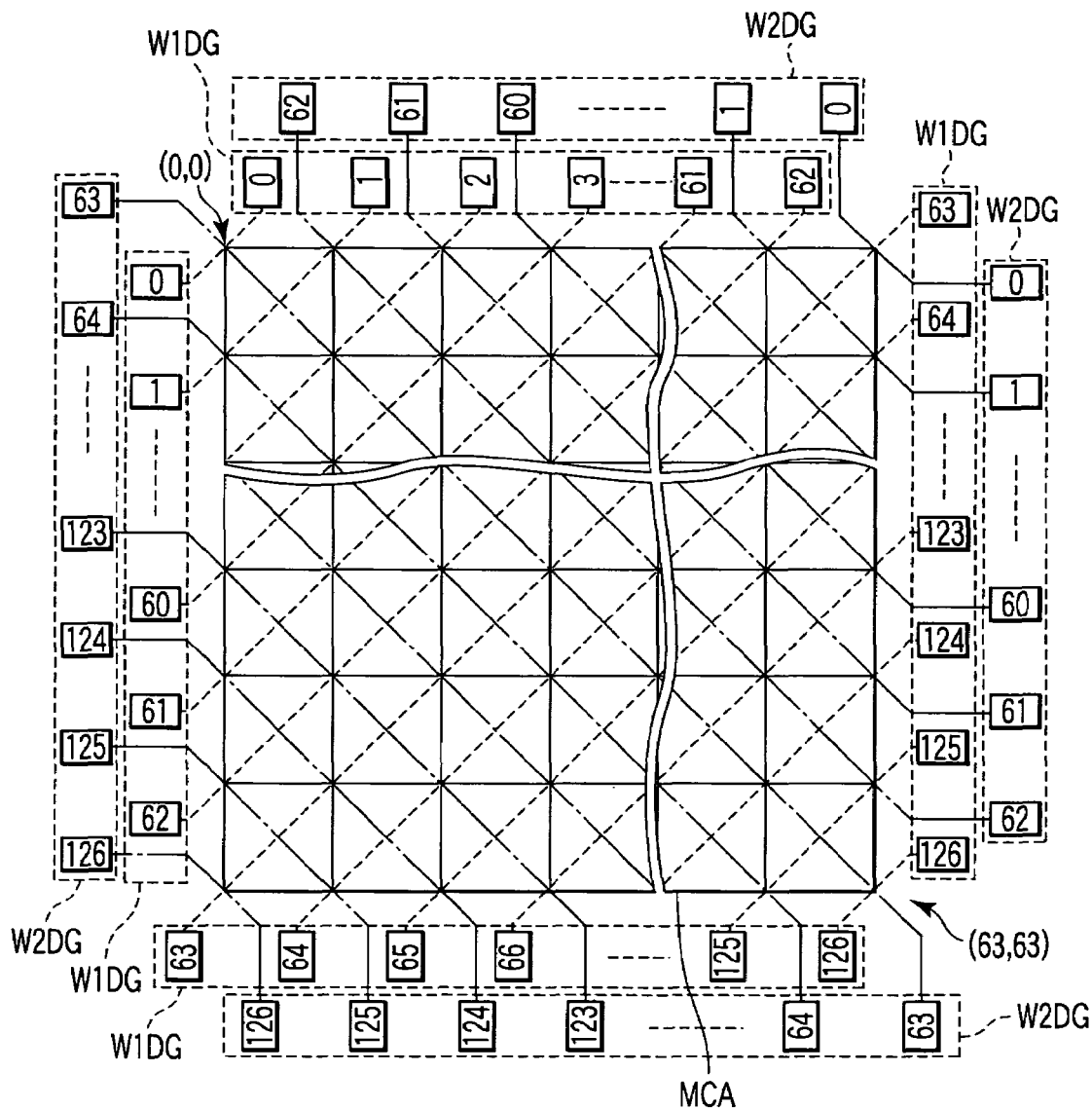
FIG. 31 shows the main part of a magnetic memory device according to the fifth embodiment, centering on a write operation.

FIG. 31 shows the main part of the magnetic memory device of the fifth embodiment, centering on a write operation. As shown in FIG. 31, write line driver groups W1DG are provided around the memory cell array MCA. Write line driver groups W2DG are provided around the write line driver groups W1DG. Although being omitted to simplify the drawing, the MTJ elements MTJ having the relationship with the write lines W1, W2 shown in FIG. 30 are provided at the intersections indicated by the coordinates (x, y) in a matrix shown by solid lines as in FIG. 5. FIG. 30 shows a case where the x-coordinates are in the integer range from 0 to 63 and the y-coordinates are in the integer range from 0 to 63.

The write lines W1 and write line drivers W1D are arranged and configured as are the write lines W3 and write line drivers W3D in the third embodiment. The write lines W2 and write line drivers W2D are arranged and configured as are the write lines W4 and write line drivers W4D in the third embodiment. The decoding method can be carried out in the identical manner with the third embodiment by determining the write line W1D by address p and the write line W2D by address q. Therefore, an explanation of these will be omitted.

With the fifth embodiment, it is possible to realize a magnetic memory device capable of decoding a write line easily by using address (x, y) as in the prior art, even when the write lines W1, W2 cross neither the x- nor y-axis of the memory cell array MCA at right angles because of employing the toggle writing method.

In a magnetic memory device to which a conventional toggle method has been applied, two write lines are arranged along the x- and y-axes of the memory cell array MCA and the magnetization easy axis direction of an MTJ element MTJ is in line with a direction inclined at an angle of 45° to the x- and y-axes. In contrast, in the fifth embodiment, the magnetization easy axis direction of an MTJ element is in line with the x- or y-axis. Therefore, it is possible to realize a memory cell array MCA smaller than the memory cell array of the magnetic memory device to which the conventional toggle method has been applied.

Sixth Embodiment

A sixth embodiment of the present invention relates to a decoding method which uses redundant cells to remedy faulty cells. Since the explanation below can be applied to the first to fifth embodiments in the identical manner, explanation will be given using the write lines W3 in the third or fourth embodiment as an example.

Figure 32:
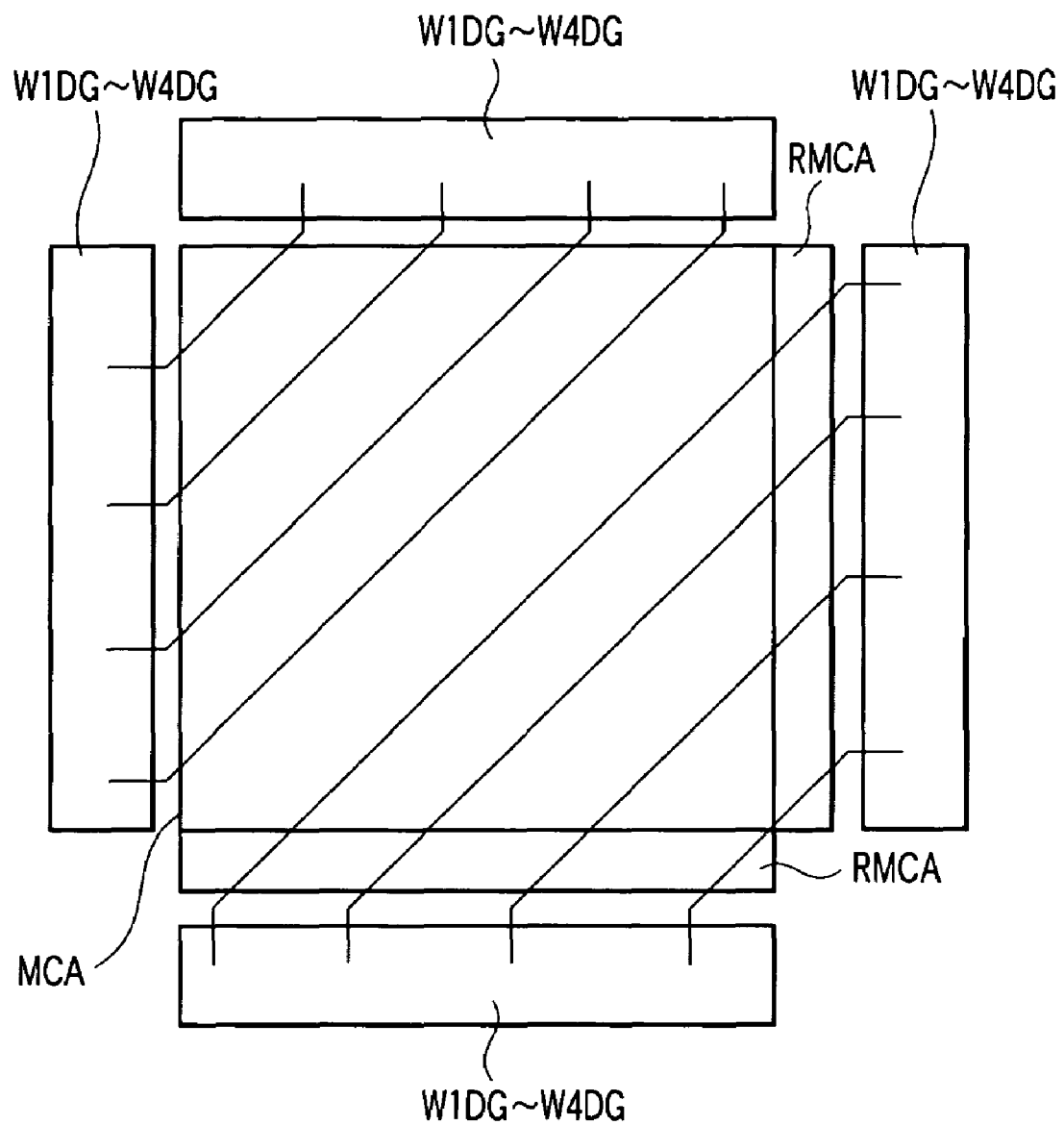
FIG. 32 shows the main part of a magnetic memory device according to a sixth embodiment of the present invention, centering on a write operation.

FIG. 32 shows the main part of the magnetic memory device of the sixth embodiment, centering on a write operation. In FIG. 32, only the write lines W3 are shown for the sake of simplification. As shown in FIG. 32, redundant memory cell arrays RMCA are provided along the right periphery or/and the left periphery and the lower periphery or/and the upper periphery of the memory cell array MCA. In a redundant memory cell array RMCA, a plurality of MTJ elements MTJ are provided in a matrix as in the memory cell array MCA. The redundant memory cell array RMCA along the right periphery of the memory cell array MCA has redundant MTJ elements MTJ in a suitable number of column or columns. Similarly, the redundant memory cell array RMCA along the lower periphery of the memory cell array MCA has MTJ elements MTJ in a suitable number of row or rows. The coordinates of the MTJ elements (second MTJ elements) in the redundant memory cell array RMCA have numbers following the coordinates of the MTJ elements (first MTJ elements) in the memory cell array MCA in a consecutive manner. The write line decoder groups W1DG to W4DG are provided around the memory cell array MCA and redundant memory cell array RMCA. Which groups are provided depends on which one of the first to fifth embodiments is implemented.

The write lines W3 extend from the memory cell array MCA to the redundant memory cell array RMCA. Then, the write lines W3 are arranged so as to pass through all of the MTJ elements in the redundant memory cell array RMCA. That is, the configuration of the memory cell array MCA and redundant memory cell array RMCA is treated as an enlarged version of the memory cell array MCA. The coordinates of the memory cell array MCA range from (0, 0) to (63, 63) as in the first to fifth embodiments.

Next, a method of decoding the write line W3 when an MTJ element MTJ in the memory cell array MCA is replaced with an MTJ element in the redundant memory cell array RMCA will be explained. When a faulty MTJ element MTJ is replaced, for example, an MTJ element belonging to a certain row is replaced with an MTJ element MTJ belonging to the row in the redundant memory cell array RMCA. An MTJ element belonging to a certain column is replaced with a redundant MTJ element MTJ belonging to the column in the redundant memory cell array RMCA. When a command to specify a faulty MTJ element is supplied, the address for the MTJ element after replacement is obtained by a known method. Then, the MTJ element MTJ after the replacement stores the information to be stored in the faulty MTJ element MTJ in place of the faulty MTJ element MTJ.

When an MTJ element MTJ belonging to the row whose y-axis coordinate is 1 is replaced with, for example, the redundant MTJ element with the coordinates (64, 1), the write line decoder W3D with the address p=x+y=65 is driven. In this embodiment, it does not matter with which MTJ element MTJ a faulty MTJ element is replaced. The point is that the write line driver to be driven is determined by substituting the coordinates of the MTJ element after replacement into the equation for the write lines (or auxiliary write lines) in each of the embodiments, regardless of with which MTJ element MTJ a faulty MTJ element is replaced.

Moreover, the operation of this embodiment can be considered as follows. In the memory cell array MCA with the maximum coordinates (m, n), the MTJ elements at the coordinates (x, y) in the part having the coordinates ranging from (0, 0) to (j, k) (j is a natural number smaller than m and k is a natural number smaller than n) function as ordinary memory cells. Then, the MTJ elements at the coordinates (x, y) in the part having the coordinates ranging from (j+1, k+1) to (m, n) function as redundant memory cells. As a result, the write lines W1 to W4 can be decoded by the methods described in the first to fifth embodiments, regardless of whether MTJ elements are ordinary ones or replacement ones.

Here, the maximum coordinate value m of the x-axis in the memory cell array MCA and redundant memory cell array RMCA is substituted into the equation q=(m−x)+y for the write lines W4 in a case where this embodiment is applied to the third or fourth embodiment.

As with the first embodiment, with the sixth embodiment, even when the redundant memory cell arrays RMCA are provided, it is possible to realize a magnetic memory device capable of writing information with a smaller current and decoding a write line easily by using address (x, y).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory device comprising:
a rectangular memory cell array including a plurality of MTJ elements provided at the coordinates (x, y) (x being an integer at least 0 and at most m [m is a natural number], and y being an integer at least 0 and at most n [n being a natural number]) of a first plane defined by an x-axis and a y-axis crossing at right angles;
a plurality of first write lines passing the MTJ elements and extending in a direction neither perpendicular nor parallel to a magnetization easy axis direction of the MTJ elements, one end of at least one of the first write lines passing an upper periphery or a lower periphery of the memory cell array, and another end of the at least one of the first write lines passing a left periphery or a right periphery of the memory cell array;
a plurality of second write lines, the first write lines and the second write lines sandwiching the MTJ elements;
a plurality of first write line drivers connected to both ends of the first write lines, one of a pair of the first write line drivers connected to both ends of at least one of the first write lines being located outside the upper periphery or the lower periphery and another one of the pair of the first write line drivers being located outside the left periphery or the right periphery; and
a plurality of second write line drivers connected to both ends of the second write lines.

2. The magnetic memory device according to claim 1, wherein the second write lines extend along the x-axis or the y-axis, and
the magnetization easy axis direction is in line with a direction at an angle to the x-axis and y-axis in the first plane.

3. The magnetic memory device according to claim 1, wherein the first write lines extend along a straight line expressed by y=−(1/a)x (a being a natural number),
an s-th (s being an integer equal to or larger than 0) one of the first write lines runs through the coordinates (0, s/a) in the s range from 0 to an and runs through the coordinates (s−an, n) in the s range from an+1 to an+m, and
current is supplied to the s-th one of the first write lines expressed by s=x+ay when information is written into one of the MTJ elements at the coordinates (x, y).

4. The magnetic memory device according to claim 1, wherein the first write lines extend along a straight line expressed by y=−ax,
a t-th (t being an integer equal to or larger than 0) one of the first write lines runs through the coordinates (t/a, 0) in the t range from 0 to am and runs through the coordinates (m, t−am) in the t range from am+1 to am+n, and
current is supplied to the t-th one of the first write lines expressed by t=ax+y when information is written into one of the MTJ elements at the coordinates (x, y).

5. The magnetic memory device according to claim 1, wherein the second write lines extend in a direction neither perpendicular nor parallel to the magnetization easy axis direction,
one end of at least one of the second write lines passes the upper periphery or the lower periphery and another end of the at least one of the second write lines passes the left periphery or the right periphery, and one of a pair of the second write line drivers connected to both ends of at least one of the second write lines is located outside the upper periphery or the lower periphery and another one of the pair of the second write line drivers is located outside the left periphery or the right periphery.

6. The magnetic memory device according to claim 5, wherein the magnetization easy axis direction is parallel to the x-axis.

7. The magnetic memory device according to claim 5, wherein the first write lines extend along a straight line expressed by $y=-(1/a)x$ (a being a natural number), an s-th (s being an integer equal to or larger than 0) one of the first write lines runs through the coordinates (0, s/a) in the s range from 0 to an and runs through the coordinates (s−an, n) in the s range from an+1 to an+m, current is supplied to the s-th one of the first write lines expressed by $s=x+ay$ when information is written into one of the MTJ elements at the coordinates (x, y), the second write lines extend along a straight line expressed by $y=-ax$, a t-th (t being an integer equal to or larger than 0) one of the second write lines runs through the coordinates (t/a, 0) in the t range from 0 to am and runs through the coordinates (m, t−am) in the t range from am+1 to am+n, and current is supplied to the t-th one of the second write lines expressed by $t=ax+y$ when information is written into one of the MTJ elements at the coordinates (x, y).

8. The magnetic memory device according to claim 5, wherein the magnetization easy axis direction extends in the x-axis direction or the y-axis direction, and either the first write lines or the second write lines extend along a straight line expressed by $y=x$ and remaining ones extend along a straight line expressed by $y=-x$.

9. The magnetic memory device according to claim 1, further comprising:

a first read line extending along the y-axis and used to read information from the MTJ elements with the y-axis coordinate y; and a second read line extending along the x-axis and used to read information from the MTJ elements with the x-axis coordinate x.

10. The magnetic memory device according to claim 1, wherein the MTJ elements include a plurality of first MTJ elements provided at the coordinates (x, y) ranging from the coordinates (0, 0) to the coordinates (j, k) (j is a natural number smaller than m, and k is a natural number smaller than n) and a plurality of second MTJ elements provided at the coordinates (x, y) ranging from the coordinates (j+1, k+1) to the coordinates (m, n), and one of the second MTJ elements stores information to be stored in a faulty one of the first MTJ elements.

11. A magnetic memory device comprising:

a rectangular memory cell array including a plurality of MTJ elements provided at the coordinates (x, y) (x being an integer at least 0 and at most m [m is a natural number], and y being an integer at least 0 and at most n [n being a natural number]) of a plane defined by an x-axis and a y-axis crossing at right angles;

a plurality of first write lines passing through the MTJ elements and extending along the x-axis;

a plurality of second write lines extending along the y-axis, the first write lines and the second write lines sandwiching the MTJ elements;

a plurality of third write lines passing through the MTJ elements and extending so as to generate a magnetic field in a direction in which a synthetic magnetic field of magnetic fields generated by the first write lines and the second write lines passing through the MTJ element to be written into points, one end of at least one of the third write lines passing an upper periphery or a lower periphery of the memory cell array, and another end of the at least one of the third write lines passing a left periphery or a right periphery of the memory cell array;

a plurality of first write line drivers connected to both ends of the first write lines;

a plurality of second write line drivers connected to both ends of the second write lines; and a plurality of third write line drivers connected to both ends of the third write lines, one of a pair of the third write line drivers connected to both ends of at least one of the third write lines being located outside the upper periphery or the lower periphery and another one of the pair of the third write line drivers being located outside the left periphery or the right periphery.

12. The magnetic memory device according to claim 11, wherein the magnetization easy axis direction extends along the x-axis or the y-axis.

13. The magnetic memory device according to claim 11, wherein the third write lines extend along a straight line expressed by $y=-x$, a p-th (p being an integer equal to or larger than 0) one of the third write lines runs through the coordinates (0, p) in the p range from 0 to n and runs through the coordinates (p−n, n) in the p range from n+1 to n+m, and current is supplied to the p-th one of the third write lines expressed by $p=x+y$ when information is written into one of the MTJ elements at the coordinates (x, y).

14. The magnetic memory device according to claim 11, wherein the third write lines extend along a straight line expressed by $y=x$, a q-th (q being an integer equal to or larger than 0) one of the third write lines runs through the coordinates (m−q, 0) in the q range from 0 to m and runs through the coordinates (0, q−m) in the q range from m+1 to m+n, and current is supplied to the q-th one of the third write lines expressed by $q=(m-x)+y$ when information is written into one of the MTJ elements at the coordinates (x, y).

15. The magnetic memory device according to claim 11, further comprising:

a plurality of fourth write lines passing through the MTJ elements and extending so as to generate a magnetic field in a direction in which a synthetic magnetic field of magnetic fields generated by the first write lines and the second write lines passing through the MTJ element to be written into points and in a direction different from the direction of the third write lines, one end of at least one of the fourth write lines passing the upper periphery or the lower periphery and the another end of the at least one of the fourth write lines passing the left periphery or the right periphery, and a plurality of fourth write line drivers connected to both ends of the fourth write lines, one of a pair of the fourth write line drivers connected to both ends of at least one of the fourth write lines being located outside the upper periphery or the lower periphery and another one of the pair of the fourth write line drivers being located outside the left periphery or the right periphery.

16. The magnetic memory device according to claim 15, wherein the third write lines extend along a straight line expressed by y=−x,
- a p-th (p being an integer equal to or larger than 0) one of the third write lines runs through the coordinates (0, p) in the p range from 0 to n and runs through the coordinates (p−n, n) in the p range from n+1 to n+m,
- current is supplied to the p-th one of the third write lines expressed by p=x+y when information is written into one of the MTJ elements at the coordinates (x, y),
- the fourth write lines extend along a straight line expressed by y=x,
- a q-th (q being an integer equal to or larger than 0) one of the fourth write lines runs through the coordinates (m−q, 0) in the q range from 0 to m and runs through the coordinates (0, q−m) in the q range from m+1 to m+n, and
- current is supplied to the q-th one of the fourth write lines expressed by q=(m−x)+y when information is written into one of the MTJ elements at the coordinates (x, y).

17. The magnetic memory device according to claim 11, further comprising:
- a first read line extending along the y-axis and used to read information from the MTJ elements with the y-axis coordinate y; and
- a second read line extending along the x-axis and used to read information from the MTJ elements with the x-axis coordinate x.

18. The magnetic memory device according to claim 11, wherein the MTJ elements include a plurality of first MTJ elements provided at the coordinates (x, y) ranging from the coordinates (0, 0) to the coordinates (j, k) (j is a natural number smaller than m, and k is a natural number smaller than n) and a plurality of second MTJ elements provided at the coordinates (x, y) ranging from the coordinates (j+1, k+1) to the coordinates (m, n), and
- one of the second MTJ elements stores information to be stored in a faulty one of the first MTJ elements.

\* \* \* \* \*